United States Patent
Gregg et al.

(10) Patent No.: US 8,614,606 B2
(45) Date of Patent: Dec. 24, 2013

(54) DELAY-LINE SELF-OSCILLATOR

(75) Inventors: John Francis Gregg, Oxford (GB); Alexy Davison Karenowska, Oxford (GB)

(73) Assignee: Salunda Limited (GB)

( * ) Notice: Subject to any disclaimer, the term of this patent is extended or adjusted under 35 U.S.C. 154(b) by 44 days.

(21) Appl. No.: 13/144,878

(22) PCT Filed: Jan. 18, 2010

(86) PCT No.: PCT/GB2010/000068
§ 371 (c)(1), (2), (4) Date: Sep. 13, 2011

(87) PCT Pub. No.: WO2010/082036
PCT Pub. Date: Jul. 22, 2010

(65) Prior Publication Data
US 2011/0316638 A1   Dec. 29, 2011

(30) Foreign Application Priority Data
Jan. 16, 2009   (GB) .................................. 0900746.9

(51) Int. Cl.
*H03B 5/24*      (2006.01)
*H03L 5/00*      (2006.01)

(52) U.S. Cl.
USPC ........................... 331/109; 331/135; 331/182

(58) Field of Classification Search
USPC .................... 331/109, 135, 182, 183
See application file for complete search history.

(56) References Cited

U.S. PATENT DOCUMENTS

| | | |
|---|---|---|
| 3,065,455 A | 11/1962 | Roth |
| 3,921,093 A | 11/1975 | Lewis |
| 3,965,416 A | 6/1976 | Friedman |
| 4,055,816 A | 10/1977 | Woskow |
| 4,070,635 A | 1/1978 | Healey, III |
| 4,325,255 A | 4/1982 | Howard et al. |
| 4,758,803 A | 7/1988 | Thomas, III |

(Continued)

FOREIGN PATENT DOCUMENTS

| | | |
|---|---|---|
| CN | 101344468 | 1/2009 |
| DE | 1811105 | 12/1969 |

(Continued)

OTHER PUBLICATIONS

International Search Report for PCT Application No. PCT/GB2010/000061 dated Aug. 27, 2010.

(Continued)

*Primary Examiner* — Joseph Chang
(74) *Attorney, Agent, or Firm* — Brinks Gilson & Lione

(57) ABSTRACT

An electrical, magnetic or electromagnetic delay line self oscillator is described with a delay line arrangement, an oscillator control circuitry, and a frequency selection impedance connecting the delay line arrangement and the oscillator control circuitry and presenting an impedance to the delay line arrangement. The oscillator control circuitry includes an amplifier, a non linear amplitude control element (N-LACE) such as an active device with a negative differential conductance that provides an output amplitude has a negative second derivative with respect to an input signal, and a driver. The modal characteristics of electromagnetic delay lines can thus be exploited across a wide range of instrumentation applications, and a means is provided to enhance the achievable functionality and/or performance of the instrumentation without the need for expensive additional electrical hardware or electronics.

24 Claims, 34 Drawing Sheets

(56) References Cited

U.S. PATENT DOCUMENTS

| | | | |
|---|---|---|---|
| 5,036,944 A | 8/1991 | Danley et al. | |
| 5,766,137 A | 6/1998 | Omata | |
| 5,895,848 A | 4/1999 | Wilson et al. | |
| 6,029,324 A | 2/2000 | Wixforth | |
| 6,378,360 B1 | 4/2002 | Bartels | |
| 6,422,813 B1 | 7/2002 | Mercadal et al. | |
| 6,963,252 B2 * | 11/2005 | Kasperkovitz | 331/108 B |
| 7,157,980 B2 | 1/2007 | Ogiso | |
| 7,629,858 B2 * | 12/2009 | Forbes et al. | 331/135 |
| 2002/0070729 A1 | 6/2002 | Muller | |
| 2002/0130587 A1 | 9/2002 | Shlimak et al. | |
| 2004/0244481 A1 | 12/2004 | Woehrle | |
| 2006/0061351 A1 | 3/2006 | Chen et al. | |
| 2006/0181361 A1 * | 8/2006 | Van De Gevel et al. | 331/158 |

FOREIGN PATENT DOCUMENTS

| | | |
|---|---|---|
| DE | 3228524 | 2/1984 |
| EP | 0 511 651 A2 | 11/1992 |
| GB | 2348962 | 10/2000 |
| WO | WO 95/06977 | 3/1995 |
| WO | WO 95/06977 A1 | 3/1995 |
| WO | WO 02/072236 | 9/2002 |

OTHER PUBLICATIONS

International Search Report for PCT Application No. PCT/GB2010/000069 dated Aug. 27, 2010.
International Search Report for PCT Application No. PCT/GB2010/000068 dated Jun. 30, 2010.
International Search Report and Written Opinion for PCT Application No. PCT/GB2010/000065 dated May 27, 2010.
Examination Report for corresponding EP Application No. 10 700 890.6 dated Sep. 26, 2012.
Examination Report for corresponding EP Application No. 10 701 562.0 dated Sep. 26, 2012.
Examination Report for corresponding EP Application No. 10 702 155.2 dated Sep. 26, 2012.
Summons to attend oral proceedings pursuant to Rule 115(1) EPC for corresponding EP Application No. 10 702 155.2 dated May 3, 2013.
Examination Report for corresponding EP Application No. 10 702 156.0 dated Sep. 26, 2012.
Summons to attend oral proceedings pursuant to Rule 115(1) EPC for corresponding EP Application No. 10 702 156.0 dated Mar. 5, 2013.

* cited by examiner

C

D

DELAY-LINE SELF-OSCILLATOR

This application is a filing under 35 U.S.C. §371 of International Patent Application PCT/GB2010/000068, filed Jan. 18, 2010, which claims priority to Great Britain Application No. 0900746.9, filed Jan. 16, 2009.

FIELD OF THE INVENTION

This invention relates to a delay-line self-oscillator device.

BACKGROUND OF THE INVENTION

Systems of electrical, electromagnetic or magnetic transmission-lines or 'delay-lines' (electrical, electromagnetic or magnetic transmission elements with a length that is at least a substantial fraction of the wavelength of the highest frequency component of an electrical, electromagnetic or magnetic signal that propagates along them) are found in various forms in engineering, scientific, and industrial instrumentation. Electrical delay-lines are in very widespread use; most commonly in the context of simple 'interconnects' i.e. channels to support communication between functional lumped electrical (or part-electrical) components. Apart from matching applications, the electrical properties particular to delay-lines are rarely exploited; indeed there is a widespread misconception that the incorporation of a section or sections of delay-line into an electrical system must be fundamentally deleterious to its overall performance. Moreover, the potential of certain electromagnetic and/or magnetic delay-line systems—in particular spin-wave delay-line systems—to form the basis of devices and systems with novel functionalities provided by their particular effective impedance properties remains largely unexplored.

SUMMARY OF THE INVENTION

Against this background, and in accordance with a first aspect of the present invention, there is provided a delay-line self oscillator as set out in claim 1.

Many electrical control and measurement instrumentation applications require long raw signal transmission line interconnects between an electrical 'element' and a set of driving electronics, for example due to the practical geometrical constraints of the engineering system. Embodiments of the present invention provide for the modal characteristics of electrical delay-lines to be exploited for a wide range of instrumentation applications, and provide a means to enhance the achievable functionality and/or performance of the instrumentation without the need for expensive additional electrical hardware or electronics.

Further embodiments of the present invention operating in conjunction with electromagnetic or magnetic delay-line systems provide for closed-loop electromagnetic or magnetic instrumentation systems—for example spin-wave self-oscillator systems—with novel functionalities.

Further features and advantages of the present invention will be apparent from the appended claims and the following description.

DETAILED DESCRIPTION OF A PREFERRED EMBODIMENT

Figure 1:
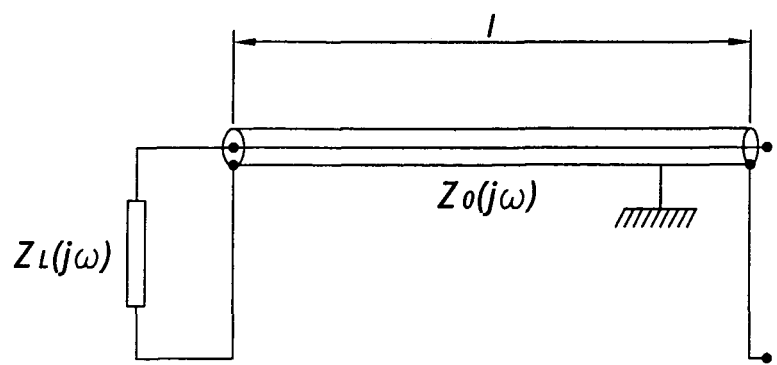
FIG. 1 shows a simple delay-line arrangement.

In their most general sense, embodiments of the present invention provide an electrical, electromagnetic or magnetic delay-line arrangement connected to an oscillator control circuitry, which employs positive feedback, so as to form a resonant system referred to henceforth as a Delay-Line Self-Oscillator. The resonant system (which includes the delay-line arrangement) is self-excited at a, or one of a number of, resonance or anti-resonance frequency/frequencies by a driving signal from the control circuitry. The delay-line arrangement may operate in any region of the electromagnetic or magnetic spectrum, for example: it may comprise a section or sections of electrical transmission line of the sort commonly employed as signal interconnects in analogue and digital signal processing systems operating at radio and microwave frequencies, or it may be a magnetic structure (for example a thin-film ferro- or ferri-magnetic waveguide) which supports the propagation of linear or non-linear spin-wave (magnetic) excitations.

Delay-Line Self-Oscillators (DLSOs) of the type described herein are examples of distributed-parameter electrical, electromagnetic or magnetic oscillators. Specifically, the DLSOs of the type referred to herein each have an operating frequency and/or quality factor (Q) that is influenced to a determinable amount by the frequency response and loss characteristics of a delay-line arrangement. The delay-line arrangement comprises at least one delay-line and may incorporate other functional active or passive electronic, electromagnetic or magnetic components—'electrical, electromagnetic or magnetic elements'. A delay-line as defined in the present context is an electrical, electromagnetic or magnetic transmission element with a characteristic dimension that is at least a substantial fraction of the wavelength of the signal that propagates along it. Many realizations of delay-lines are possible in the present context; for example, a delay-line may comprise a length of coaxial transmission line, an electrical or magnetic waveguide, or a path in free space etc.

Any delay-line may be described in terms of an effective length l, effective characteristic impedance (defined as the ratio of two quantities conserved across line interfaces):

$$Z_0(j\omega) = \sqrt{\frac{R_0 + j\omega L_0}{G_0 + j\omega C_0}} \quad (1)$$

and effective propagation coefficient:

$$\gamma = \alpha + j\frac{\omega}{v_p} = \alpha + j\beta. \quad (2)$$

Here, $R_0$, $L_0$, $G_0$ and $C_0$ are respectively the effective per-unit length resistance, inductance, shunt conductance and shunt capacitance of the delay-line, $v_p$ is the phase velocity along it, $\omega$ the frequency of excitation and $\alpha$ a loss coefficient. An electrical, electromagnetic or magnetic element forming part of a 'delay-line arrangement' in the present context is defined as any electrical, electromagnetic or magnetic system or component that is separated from the DLSO control circuitry 30 by at least one section of delay-line. Depending on the requirements of the DLSO (i.e. the application of the technology), the frequency of the driving signal (i.e. the operating frequency of the DLSO) may be substantially dependent upon or substantially independent of changes in the characteristics of certain electronic, electromagnetic or magnetic components or sections of delay-line forming part of the delay-line arrangement.

In general, delay-line arrangements encompassed by embodiments of the present invention exhibit input/output phase responses which vary continuously with frequency over some finite bandwidth. A given delay-line arrangement has an effective frequency dependent input impedance $Z_{in}(j\omega)$. The magnitude of the frequency response of the input impedance $|Z_{in}(j\omega)|$ features minima and maxima. Minima correspond to resonance frequencies, maxima to anti-resonance frequencies of the delay-line arrangement. The exact form of the input impedance of the delay-line arrangement is dependent on the detail of the system (i.e. multiplicity, type and arrangement of electrical, electromagnetic or magnetic element(s) and delay-line(s) incorporated).

The principles underlying the delay-line arrangement encompassed by embodiments of the present invention may be better understood by consideration of a single electrical delay-line terminated by a load $Z_L(j\omega)$. $Z_L(j\omega)$ may take any real, imaginary or complex value including zero and infinity (i.e. the delay-line may have any terminating impedance including open or short-circuit). FIG. 1 shows such a system in which the delay-line is a single length of co-axial electrical transmission line. The input impedance $Z_{in}(j\omega)$ of a delay-line arrangement comprising a transmission line, length of characteristic impedance $Z_0(j\omega)$, terminated by a complex frequency dependent impedance $Z_L(j\omega)$ is described by $$Z_{in}(j\omega) = Z_0(j\omega)\frac{(Z_L(j\omega) + Z_0(j\omega)\tanh\gamma l)}{(Z_0(j\omega) + Z_L(j\omega)\tanh\gamma l)} \quad (3)$$

where symbols are as defined in (1) and (2) above.

For the purposes of illustration the frequency response characteristics of a particular electrical implementation of the delay-line arrangement in FIG. 1 may be computed. For brevity it is assumed that the resistance $R_0$ and conductance $G_0$ of the delay-line are sufficiently small as to be negligible. Nevertheless the following analysis may readily be extended to delay-lines with appreciable attenuation. For a delay-line with negligible loss, the expression of (1) simplifies to $$Z_0(j\omega) = Z_0 = \sqrt{\frac{L_0}{C_0}}, \quad (4)$$

which is purely real and frequency independent. Additionally, when these conditions are met, the loss coefficient $\alpha$ of (2) is approximately zero (i.e. $\gamma=j\beta$) and thus (3) may be approximated by $$Z_{in}(j\omega) = Z_0 \frac{(Z_L(j\omega) + jZ_0\tan\beta l)}{(Z_0 + jZ_L(j\omega)\tan\beta l)}. \quad (5)$$

Figure 2:
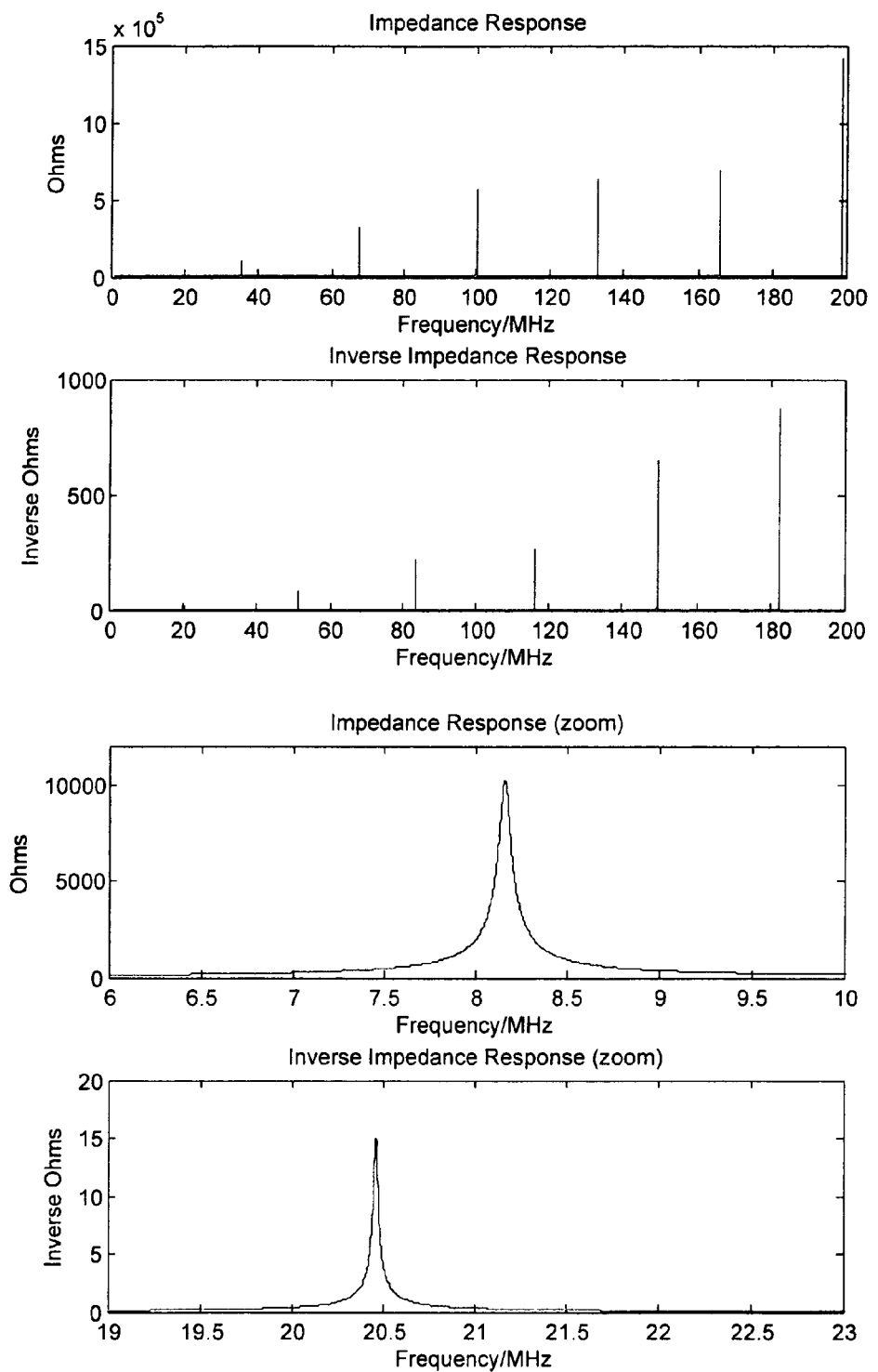
FIG. 2A shows a plot of the magnitude of input impedance as a function of frequency for a delay-line such as is depicted in FIG. 1.
FIG. 2B shows a plot of the inverse of the magnitude of input impedance as a function of frequency for a delay-line such as is depicted in FIG. 1.
FIG. 2C shows a magnified view of a part of the plot of FIG. 2A.
FIG. 2D shows a magnified view of a part of the plot of FIG. 2B.

For such an arrangement with the parameter values shown in Table 1, FIG. 2A is a plot of the magnitude of the input impedance $|Z_{in}(j\omega)|$ defined in (5) above, as a function of frequency. The first peak which occurs between 7.5 and 9 MHz (illustrated in the magnified view, FIG. 2C) corresponds to the first anti-resonance frequency of the delay-line arrangement. Subsequent peaks are harmonics. Equation (5) predicts an infinite series of anti-resonance frequencies. In practice, the highest observable harmonic is limited by the real transport properties of the electrical system. FIG. 2B is a plot of the inverse of the magnitude of the input impedance as a function of frequency. The first peak, which occurs between 20 and 21 MHz (illustrated in the magnified view, FIG. 2D) corresponds to the first resonance frequency of the delay-line arrangement, subsequent peaks are harmonics. Equation (5) predicts an infinite series of resonance frequencies. In practice the highest observable harmonic is limited by the real transport properties of the electrical system.

TABLE 1

| Parameter | Symbol | Value |
| --- | --- | --- |
| Delay-line length | l | 3 m |
| Delay-line char. impedance | $Z_0$ | 50Ω |
| Delay-line phase velocity | $v_p$ | $2 \times 10^8$ ms$^{-1}$ |
| Delay-line termination | $Z_L(j\omega)$ | $[(0.5 + j\omega10^{-6})^{-1} + j\omega2.5 \times 10^{-12}]^{-1}$ Ω |

Figure 3:
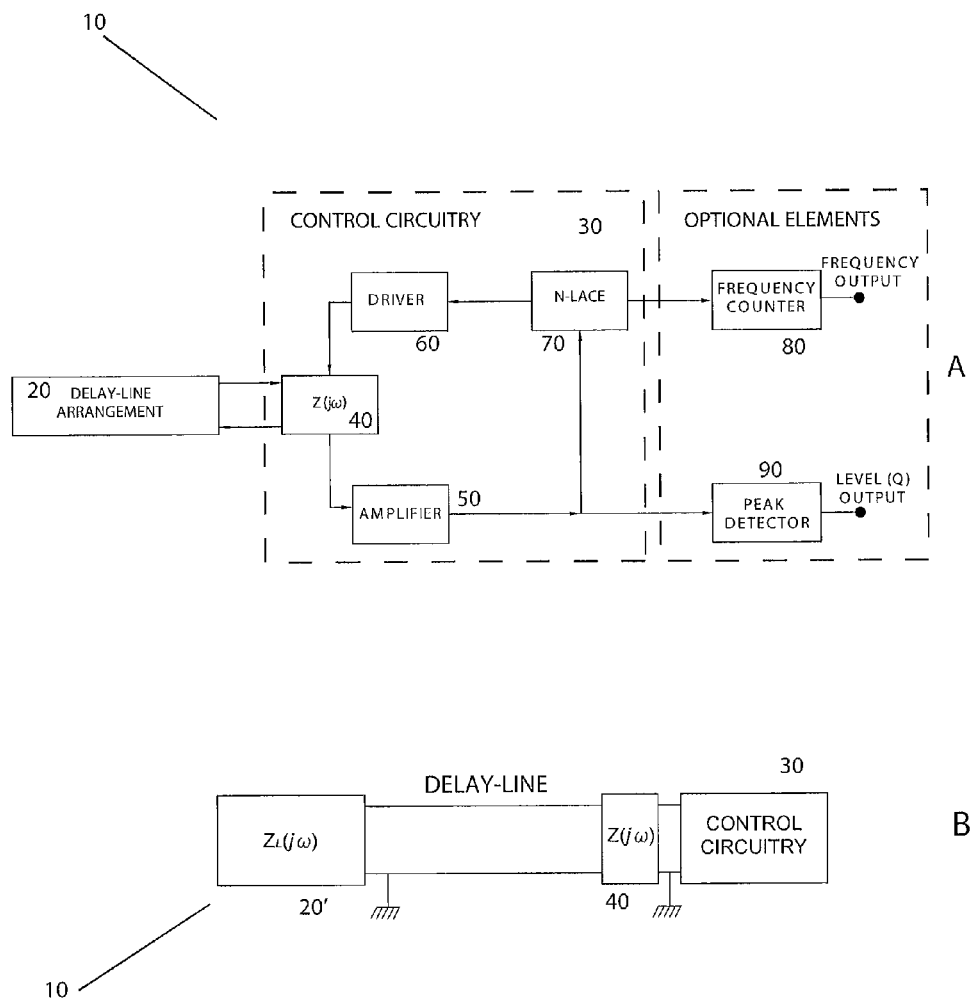
FIG. 3A shows a Delay-Line Self Oscillator (DLSO) embodying the present invention and including a control circuitry having a Non-Linear Amplitude Control Element (N-LACE) linked to a delay-line arrangement via a frequency selection impedance.
FIG. 3B shows a block schematic diagram of the functional components of an arrangement of FIG. 3A.

FIG. 3A is a block diagram illustrating the various functional components of a DLSO 10. The combination of electrical, electromagnetic or magnetic element(s) and delay-line(s)—together represented as a delay-line arrangement 20—is shown on the left of the diagram. The delay-line arrangement 20 is connected to the rest of the functional elements of the closed-loop system: collectively the control circuitry 30 together with an optional frequency counter 80 and peak detector 90, via a frequency selection impedance 40, $Z(j\omega)$. The control circuitry 30 contains an amplifier 50, a driver 60 and an amplitude regulator 70. These features may or may not be realized by a single electronic or electromagnetic circuit, but are the minimum components necessary for the realization of a self-oscillating system. For example, the amplifier 50 may be a non-inverting pre-amplifier realized in discrete or surface mount electronic components and incorporating a low noise, high input impedance operational amplifier. The characteristics of the N-LACE 70, together with some examples of circuits providing these characteristics, are set out in further detail below. In general terms, however, it may be noted that the non-linear characteristics of the N-LACE 70 might be obtained using a variety of instrumentation techniques: the element may comprise or incorporate an active electrical, electromagnetic or magnetic device with a negative differential conductance by virtue of a physical positive-feedback process. Alternatively, the desired non-linear characteristic may be achieved via a positive-feedback amplifier configuration.

The optional frequency counter 80 and peak detector 90 provide for signal processing/capture if appropriate. The frequency counter 80 permits provision of a frequency output. The peak detector (or demodulator) 90 may additionally or alternatively provide an output indicative of the level of oscillation of the delay-line arrangement 20. Equally, the DLSO 10 may be incorporated into a control, instrumentation or signal processing system where no such outputs are desirable.

During a transient start-up period the control circuitry 30 commences oscillation. Noise initiated oscillations are received by the amplifier 50, amplified, processed by the amplitude controller (N-LACE) 70, the specific details of which are set out below, and fed back to the delay-line arrangement 20 via $Z(j\omega)$ 40. Once the start-up period has passed, constant amplitude oscillation is established. The combination of the delay-line arrangement 20, $Z(j\omega)$ 40 and the control circuitry 30 are arranged in such a way as to promote stable, robust oscillation of the closed-loop system. Particularly, the frequency selection impedance $Z(j\omega)$ 40 has a certain frequency-dependent magnitude and/or phase shift which provides modal selectivity. Again this will be explained further below. The frequency selection impedance may operate in the electrical, electromagnetic or magnetic domains.

FIG. 3B is a block schematic diagram of a realization of the DLSO 10 in conjunction with the example implementation of the delay-line arrangement 20 given above—a single transmission line terminated by an impedance $Z_L(j\omega)$ 20'.

A theoretical analysis of the DLSO described above is set out in Appendix A for the sake of completeness. This Appendix also describes the conditions required for stable, sustained operation of any DLSO in accordance with the present invention.

Figure 4A:
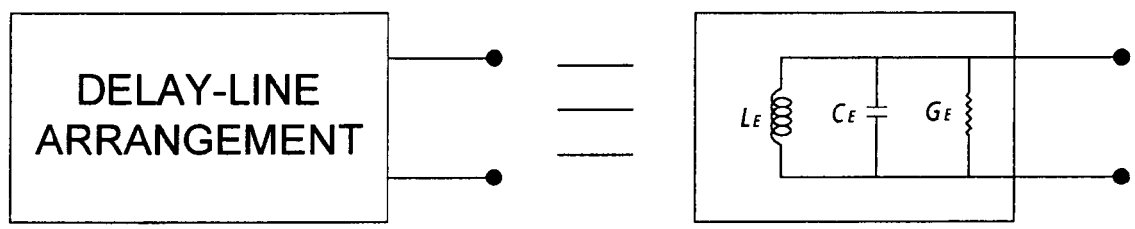
FIG. 4A shows the electrical equivalent circuit of a delay-line arrangement and frequency selection impedance.
Figure 4B:
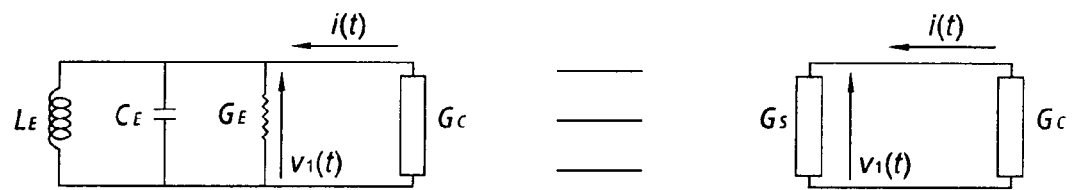
FIG. 4B shows an electrical equivalent circuit of the DLSO of FIG. 3A.
Figure 4C:
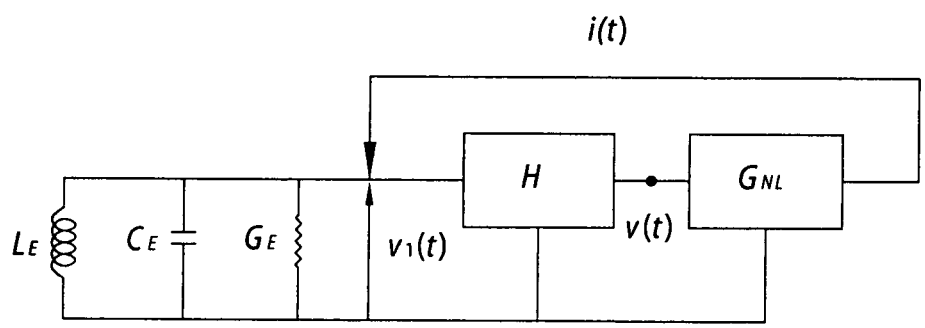
FIG. 4C illustrates an alternative electrical equivalent circuit of the DLSO of FIG. 3A.

Appendix A describes the characteristics of the N-LACE 70 by treating the DLSO 10 in terms of an entirely electrical equivalent two terminal electrical circuit, as shown in FIGS. 4A, 4B and 4C, with three shunt elements: an effective inductance $L_E$, a capacitance $C_E$, and a conductance $G_E$, together having a combined impedance $G_S$.

In this representation, the control circuitry 30 incorporating the non-linear amplitude control element (N-LACE) 70 may be modelled by a shunt conductance $G_C$ as depicted in FIGS. 4B and 4C, and the operation of the DLSO 10 may be described in terms of two time-dependent oscillator control signals: an equivalent current 'output signal' i(t) which flows into the combined impedance $G_S$, and originates from $G_C$, and an equivalent voltage 'input signal' $v_1(t)$ which appears across $G_S$. In general, $G_C$ will be a complex, frequency dependent effective conductance with a negative real part and non-linear dependence on $v_1(t)$.

For the purposes of analysis, it is useful to consider functionality of the non-linear amplitude control element (N-LACE) 70 separately from that of the rest of the circuitry of the control circuitry 30. The model of FIG. 4C is equivalent to that of FIG. 4B but here, the control circuitry 30 of the DLSO 10 is represented by two complex, frequency dependent elements: $G_{NL}$ representing the N-LACE 70 and H which accounts for the remainder of the functional elements of the control circuitry 30. In this model H is assumed to be entirely linear in $v_1(t)$ thus, with reference to the figure, the input to the N-LACE 70 v(t), is a linear function of $v_1(t)$ whilst the output of the N-LACE 70 i(t) is a non-linear function of v(t).

The function of the non-linear amplitude control element (N-LACE) 70 is to provide an amplitude regulated feedback signal i(t) to drive the delay-line arrangement 20. In general terms, the N-LACE 70 provides gain and non-linearity. There are several ways in which this can be achieved, although as will be seen, some of these are more preferred than others since they provide for optimized performance of the DLSO 10.

The output of the delay-line arrangement 20—$v_1(t)$ (FIG. 4C)—is a continuous periodic energy signal. The signal $v_1(t)$ has a spectral component s(t) at the operating frequency $\omega_0$ of the DLSO 10. The time-period T characteristic of s(t) is given accordingly by:

$$T = \frac{2\pi}{\omega_0}. \tag{6}$$

The signal s(t) is isolated from $v_1(t)$ (e.g. by filtering and subsequent phase-compensation) so that the signal arriving at the input to the N-LACE 70 is of the form $$v(t) = As(t - \tau_1), \tag{7}$$

where A is a constant and $\tau_1$ a time-constant to account for inherent or imposed time delay and/or phase shift in the signal path. The feedback signal generated by the N-LACE 70 in response to v(t) is of the form:

$$i(t) = a_{NL}(v(t - \tau_2)). \tag{8}$$

where $$\tau_2 = \tau_1 + \tau. \tag{9}$$

and $\tau$ is a time delay characteristic of the input-output conversion in the N-LACE 70 which may or may not be frequency dependent. The instantaneous dynamic gain of the N-LACE 70 is defined for any instantaneous signal input $v(t_1)$.

$$g_d(t_1) = \frac{\partial i(t_1 + \tau)}{\partial v(t_1)} \tag{10}$$

In the most general implementation of the DLSO 10, the function $a_{NL}(v(t))$ which describes the N-LACE 70 is an arbitrary non-linear function. However, in preferred embodiments of the N-LACE 70, the function $a_{NL}(v(t))$ has particular advantageous characteristics. From henceforth, a non-linear amplitude control element with such particular advantageous characteristics will be referred to as an optimal non-linear amplitude control element or oN-LACE. The characteristics of such an oN-LACE will now be described.

When at time $t_1$ the instantaneous amplitude of the oN-LACE input signal $v(t_1)$ is between certain preset fixed 'positive' and 'negative' thresholds the corresponding output $i(t_1 + \tau)$ of the oN-LACE 70 is approximately equivalent to a linear amplifier with a gain that is—in the most general case—dependent on the polarity of the signal. For a given oN-LACE implementation, the 'positive' and 'negative' thresholds are respectively $$+\frac{B_1}{K_{01}} \text{ and } -\frac{B_2}{K_{02}}$$

where $B_1$, $B_2$ are any real, non-negative integers (so long as in a given realization either $B_1$ or $B_2$ is non-zero) and $K_{01}$ and $K_{02}$ are real non-zero positive integers equal to the small-signal (SS) dynamic gains for positive and negative v(t) respectively:

$$g_{dSS^+}(t_1) = K_{01} = \frac{\partial i(t_1 + \tau)}{\partial v(t_1)}\bigg|_{SS^+}, \tag{11a}$$

$$g_{dSS^-}(t_1) = K_{02} = \frac{\partial i(t_1 + \tau)}{\partial v(t_1)}\bigg|_{SS^-}. \tag{11b}$$

In this signal regime, the output of the oN-LACE 70 is described by:

$$i(t_1+\tau) = K_{01}v(t_1) \text{ for sgn}\{v(t_1)\}=1,$$

$$i(t_1+\tau) = K_{02}v(t_1) \text{ for sgn}\{v(t_1)\}=-1. \tag{12}$$

Note that the relative polarities of the oN-LACE input and output signals are arbitrarily defined. In the most preferred embodiment of the oN-LACE 70, at least one of $K_{01}$ and $K_{02}$ is a large, positive, real constant. Equation (12) describes the 'quasi-linear amplification regime' or 'small-signal amplification regime' of the oN-LACE 70.

If at time $t_1$ the instantaneous amplitude of $v(t_1)$ is positive and its magnitude equals or exceeds the threshold $$\frac{B_1}{K_{01}}$$

and/or the instantaneous amplitude of $v(t_1)$ is negative and its magnitude equals or exceeds the threshold $$\frac{B_2}{K_{02}},$$

the oN-LACE 70 operates in a 'strongly non-linear' or 'large-signal' regime. In the most preferred embodiment of the oN-LACE 70, the dynamic gain in the large-signal (LS) regime is zero regardless of the polarity of the signal $v(t_1)$:

$$g_{dLS}(t_1) = \frac{\partial i(t_1 + \tau)}{\partial v(t_1)}\bigg|_{LS} = 0. \tag{13a}$$

In a general embodiment of the oN-LACE, the large-signal dynamic gain $g_{dLS}(t)$ is approximately zero regardless of the polarity of the signal $v(t_1)$ i.e:

$$g_{dLS}(t_1) = \frac{\partial i(t_1 + \tau)}{\partial v(t_1)}\bigg|_{LS} \approx 0. \tag{13b}$$

The most preferred embodiment of the optimal non-linear amplitude control element features a large-signal regime in which the amplitude of the oN-LACE output $i(t_1+\tau)$ takes a constant value $+B_1$ if at time $t_1$ the instantaneous amplitude of v($t_1$) is positive and a constant value $-B_2$ if the converse is true. This behaviour is summarized by:

$$\text{if } |v(t_1)| \geq \frac{B_1}{K_{01}} \text{ and } \text{sgn}[v(t_1)] = 1, |i(t_1 + \tau)| = +B_1, \quad (14)$$

$$\text{whilst if } |v(t_1)| \geq \frac{B_2}{K_{02}} \text{ and } \text{sgn}[v(t_1)] = -1, |i(t_1 + \tau)| = -B_2.$$

In the special case that $B_1=B_2=B$ and $K_{01}=K_{02}=K_0$, (14) becomes:

$$\text{if } |v(t_1)| \geq \frac{B}{K_0} \text{ and } \text{sgn}[v(t_1)] = 1, |i(t_1 + \tau)| = +B|, \quad (15)$$

$$\text{whilst if } |v(t_1)| > \frac{B}{K_0} \text{ and } \text{sgn}[v(t_1)] = -1, |i(t_1 + \tau)| = -B|$$

and a symmetrical oN-LACE input signal v($t_1$) results in a symmetrical output function i($t_1$+τ).

Between the quasi-linear and strongly non-linear signal regimes of the oN-LACE there is a 'transitional' signal region or 'transition region' (T). In this region, the behaviour of the non-linear amplitude control element is neither quasi-linear nor strongly non-linear. In the most preferred embodiment of the oN-LACE the transition region is negligibly wide.

Figure 5:
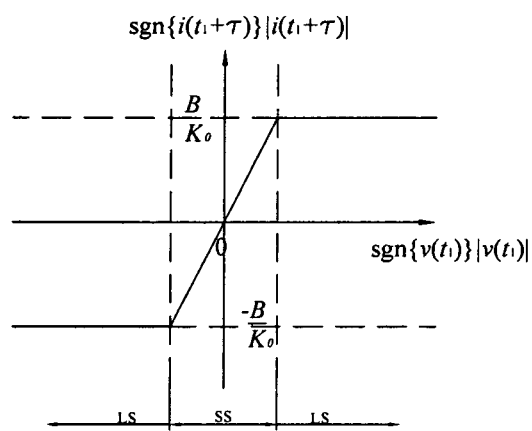
FIG. 5 shows an optimized, idealised input-output characteristic of the N-LACE of FIG. 3A constituting an "optimal Non-Linear Amplitude Control Element" (oN-LACE) characteristic.

FIG. 5 illustrates the most preferred input-output characteristics of the oN-LACE for the case that: $B_1=B_2=B$ and $K_{01}=K_{02}=K_0$, (15); there is no transitional (T) signal regime; the small-signal (SS) dynamic gain is independent of |v($t_1$)| and the large-signal (LS) dynamic gain is zero (13a).

Three key features of the oN-LACE are: Feature 1: a sharp transition between the quasi-linear (small-signal) and strongly non-linear (large-signal) regimes effected by the instantaneous signal magnitude |v($t_1$)| exceeding a pre-determined threshold the value of which may or may not be dependent on the polarity of the signal (c.f. (14), (15)); Feature 2: a narrow and preferably negligibly wide transitional signal regime; Feature 3: approximately instantaneous transition between quasi-linear and strongly non-linear regimes. Feature 3 is equivalent to the oN-LACE 70 having capacity to respond to changes in the amplitude (and frequency) of the instantaneous input signal v($t_1$) on a timescale typically significantly shorter than the characteristic signal period T i.e the oN-LACE 70 has a certain amplitude temporal resolution Δτ<<T. Furthermore, with a particular implementation of the oN-LACE described in the context of the present invention, it may be arranged that the instantaneous amplitude of the oN-LACE output i($t_1$) corresponds approximately instantaneously to that of the input i.e. if desirable, it may be arranged that the time-constant τ defined in (9) is negligibly small. Alternatively and more generally, the oN-LACE 70 is designed such that a certain known time-delay τ (which may or may not be frequency dependent) exists between oN-LACE input and corresponding output; in such a system an oN-LACE input v($t_1$) gives rise to an output i($t_1$+τ) with amplitude temporal resolution Δτ independent of τ. It is an important and particular feature of the present invention that the amplitude control achieved via the oN-LACE 70 is not of a slow-acting 'averaging' type. Moreover, changes in the centre frequency or dominant frequency component of the input signal v($t_1$) may be resolved on a time-scale comparable with the amplitude temporal resolution Δτ; i.e. the frequency content of a general output signal i($t_1$+τ) corresponds to the instantaneous frequency content of the input v($t_1$).

The input-output signal characteristics of the oN-LACE 70 are now considered, for the special case that the input is a symmetrical, sinusoidal waveform with frequency $\omega_0$ and period of oscillation T (6). Asymmetrical input signals are described subsequently. With reference to (8) and (9) and the analysis there, it is assumed that the oN-LACE input signal v(t+$\tau_1$) is a time-shifted, linearly amplified derivative of a signal s(t): a monochromatic signal at the operating frequency of the DLSO 10, $\omega_0$. For clarity in this section all signals are referenced relative to time t defined by s(t):

$$s(t)=a \sin \omega_0 t, \quad (16a)$$

$$v(t+\tau_1)=A \sin \omega_0 t. \quad (16b)$$

Figures 6A, 6B, 6C:
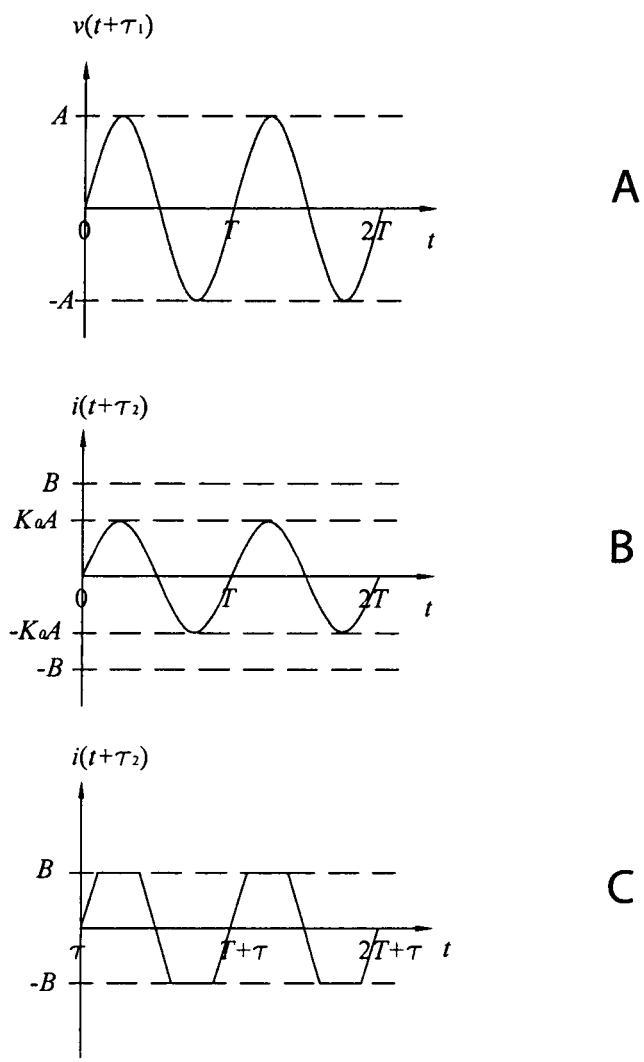
FIG. 6A shows a symmetrical sinusoidal input signal.
FIGS. 6B-6G show different output signals, for an optimized realization (oN-LACE) of the N-LACE of FIG. 3A.

The oN-LACE input signal (16b) is depicted in FIG. 6A. In the analysis that follows, the particular case is considered that the positive and negative amplitude thresholds characteristic of the oN-LACE 70 have equal magnitude (i.e. (15) holds), that the small-signal regime is characterized by a certain constant dynamic gain $K_0$ independent of the polarity of the signal v(t+$\tau_1$), that the large-signal dynamic gain is zero and that there is no transitional signal regime.

In the quasi-linear amplification regime, the output signal from the oN-LACE 70 is given by a time-shifted, linearly amplified version of the input signal:

$$i(t+\tau_2)=AK_0 \sin \omega_0 t. \quad (17)$$

FIG. 6B shows the output i(t+$\tau_2$) of the non-linear amplitude control element for the case that for the entire period T of the signal $$v(t + \tau_1), |v(t + t_1)| \leq \frac{B}{K_0},$$

i.e. the oN-LACE 70 operates continuously in the quasi-linear amplification regime.

FIG. 6C shows the output from the non-linear control element i(t+$\tau_2$) for the case that during around half of the period of the input signal T, $$|v(t + \tau_1)| > \frac{B}{K_0}.$$

The function of the oN-LACE 70 is to amplify the received monochromatic energy signal v(t+$\tau_1$) at $\omega_0$ (in general an amplified, time-shifted, phase compensated version of a raw signal s(t)), and redistribute its RMS power over harmonics of the signal frequency $\omega_0$. The Fourier series describing the oN-LACE input and output signals may be analysed to give an insight into how the distribution of power is affected by the amplitude A of the input signal v(t+$\tau_1$). In particular a Fourier representation of the output signal of the oN-LACE may be derived, which corresponds to a symmetrical sinusoidal input of general amplitude A assuming oN-LACE characteristics as described above.

Figure 7:
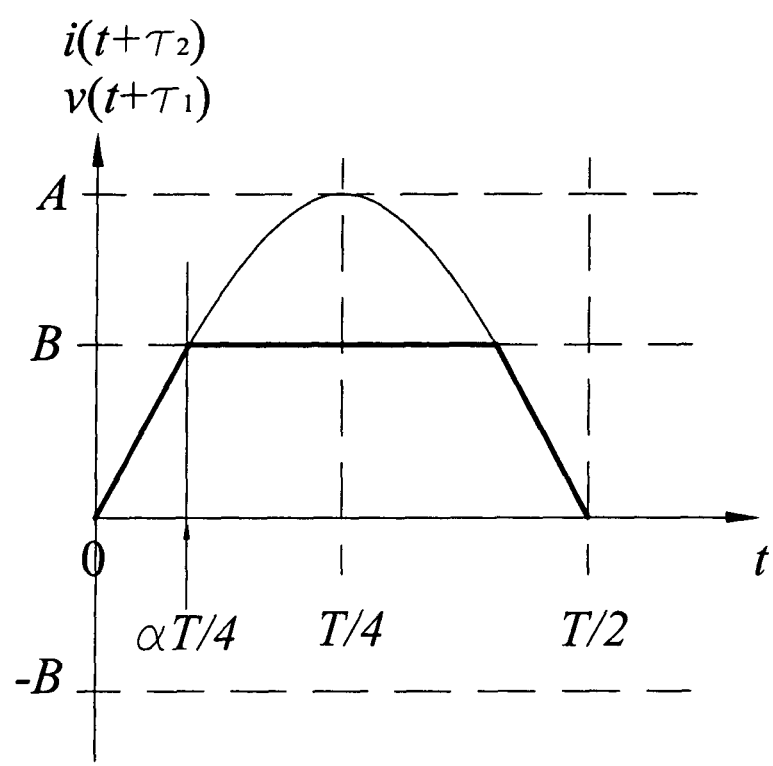
FIG. 7 shows a single positive half cycle of the input signal of FIG. 6A superimposed upon a single positive half cycle of the output signal of an optimized realization (oN-LACE) of the N-LACE of FIG. 3A.

FIG. 7 shows a single positive half-cycle of v(t+$\tau_1$) and, superimposed (bold), a single positive-half cycle of a corresponding oN-LACE output i(t+$\tau_2$). The limiting values of the oN-LACE output, ±B are indicated. It is assumed that the ratio A/B is such that for a fraction (1−α) of a quarter-cycle, $$|v(t+\tau_1)| \geq \frac{B}{K_0}$$

i.e. for the positive half-cycle $$|v(t+\tau_1)| \geq \frac{B}{K_0} \text{ for } \frac{\alpha T}{4} < t + \tau_1 \leq \frac{T}{4}(2-\alpha)$$

whilst for the negative half-cycle $$-|v(t+\tau_1)| \leq -\frac{B}{K_0} \text{ for } \frac{T}{4}(2+\alpha) < t + \tau_1 \leq \frac{T}{4}(4-\alpha).$$

The constant B and angle $\alpha$ are related by $$\alpha = \frac{2}{\pi} a \sin\left(\frac{B}{AK_0}\right). \tag{18}$$

For all possible values of $AK_0$, the periodicity and symmetry of $i(t+\tau_2)$ are preserved. Thus the Fourier series describing $i(t+\tau_2)$ is of the form $$i(t+\tau_2) = b_1 \sin\omega_0(t+\tau_2) + \sum_3^\infty b_n \sin n\omega_0(t+\tau_2) \, n = \tag{19}$$

$$2m+1 \text{ for } m = 1, 2, 3, \ldots$$

with coefficients $$b_1 = AK_0\left(\alpha - \frac{1}{\pi}\sin(\pi\alpha)\right) + \frac{4B}{\pi}\cos\left(\frac{\pi}{2}\alpha\right), \tag{20a}$$

$$b_n = \frac{2AK_0}{\pi}\left\{\frac{1}{(1-n)}\sin\left((1-n)\frac{\pi}{2}\alpha\right) - \frac{1}{(1+n)}\sin\left((1+n)\frac{\pi}{2}\alpha\right)\right\} + \tag{20b}$$

$$\frac{4B}{n\pi}\cos\left(n\frac{\pi}{2}\alpha\right).$$

Figures 6D, 6E, 6F, 6G:
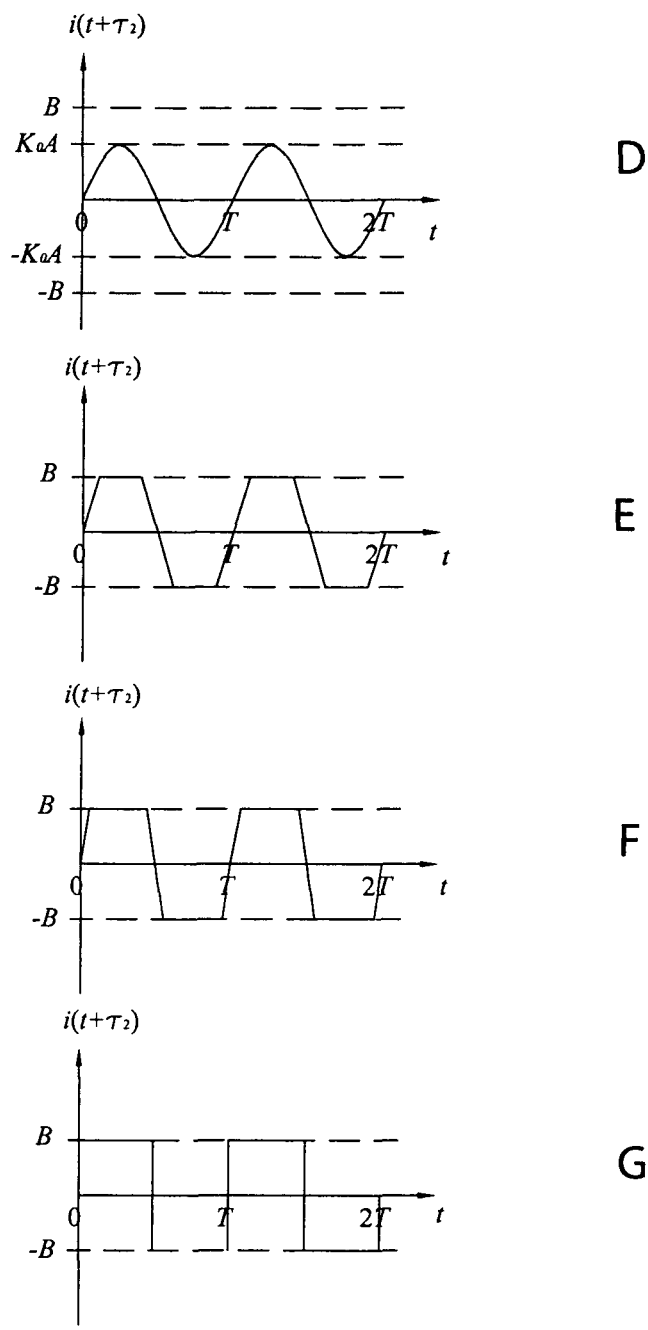

For constant B and increasing $AK_0$, the fraction $\alpha$ decreases and $i(t+\tau_2)$ tends to a square wave with fundamental frequency component $\omega_0$. FIGS. 6D-G illustrate $i(t+\tau_2)$ for increasing A. FIG. 6G illustrates the waveform for the limiting case $AK_0 \gg B$, $\alpha \to 0$. When the latter condition is fulfilled, the power in the signal $i(t+\tau_2)$ at the fundamental frequency $\omega_0$ is given by $$P_0 = \left(\frac{4B}{\pi}\right)^2. \tag{21}$$

Whilst the total power is the summation $$P = P_0 + \sum_3^\infty \left(\frac{4B}{n\pi}\right)^2 \, n = 2m+1 \text{ for } m = 1, 2, 3, \ldots \tag{22}$$

The summation (22) has a finite limit:

$$P = 2B^2. \tag{23}$$

Thus as $AK_0 \to d$ where $d \gg B$ and $\alpha \to 0$, the ratio $P_0/P$ tends to a finite limit $S_1$:

$$S_l = \frac{8}{\pi^2} = 0.8106. \tag{24}$$

Figure 8:
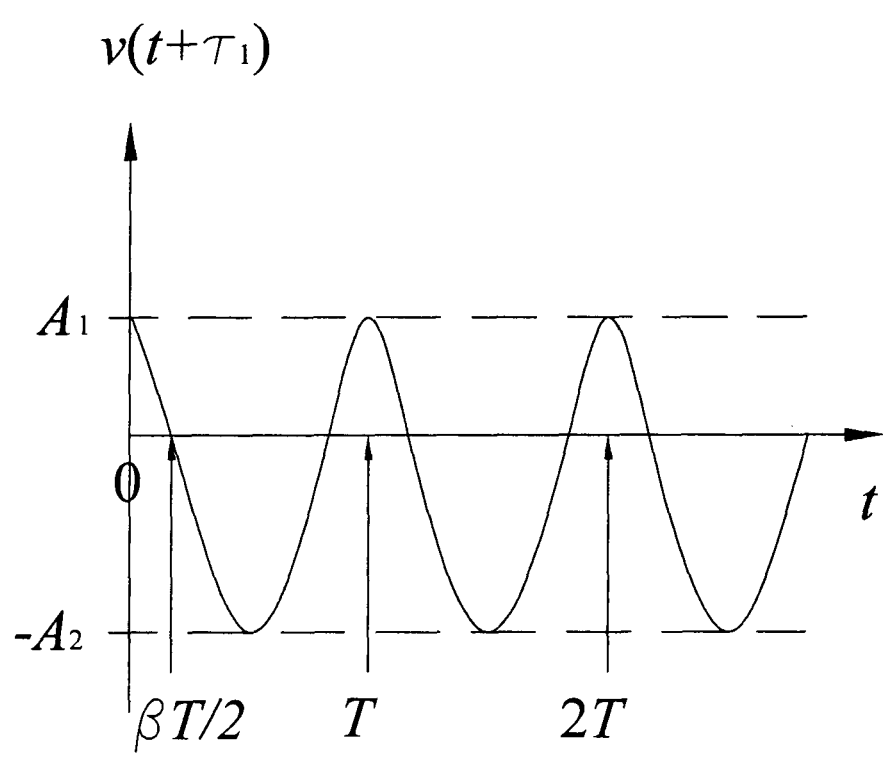
FIG. 8 shows an asymmetric input signal for the N-LACE of FIG. 3A.

The Fourier analysis above may be extended to input waveforms of lower symmetry. For the purposes of illustration the simple asymmetric input function depicted in FIG. 8 may be considered, for which a single signal period T comprises a symmetrical positive cycle of duration $\beta T$ and peak amplitude $A_1$ and a symmetrical negative cycle of duration $(1-\beta)T$ of peak amplitude $A_2$ where $\beta \neq 0.5$. The Fourier representation of the asymmetric output signal $i(t+\tau_2)$ of the oN-LACE 70 may be derived in the large-signal regime for the particular case that the positive and negative amplitude thresholds characteristic of the oN-LACE 70 have magnitude $B_1$ and $B_2$ respectively, that the small-signal regime is characterized by a certain constant dynamic gain $K_0$ independent of the polarity of the input signal $v(t_1+\tau_1)$, that the large-signal dynamic gain is zero and that there is no transitional signal regime.

Figure 9:
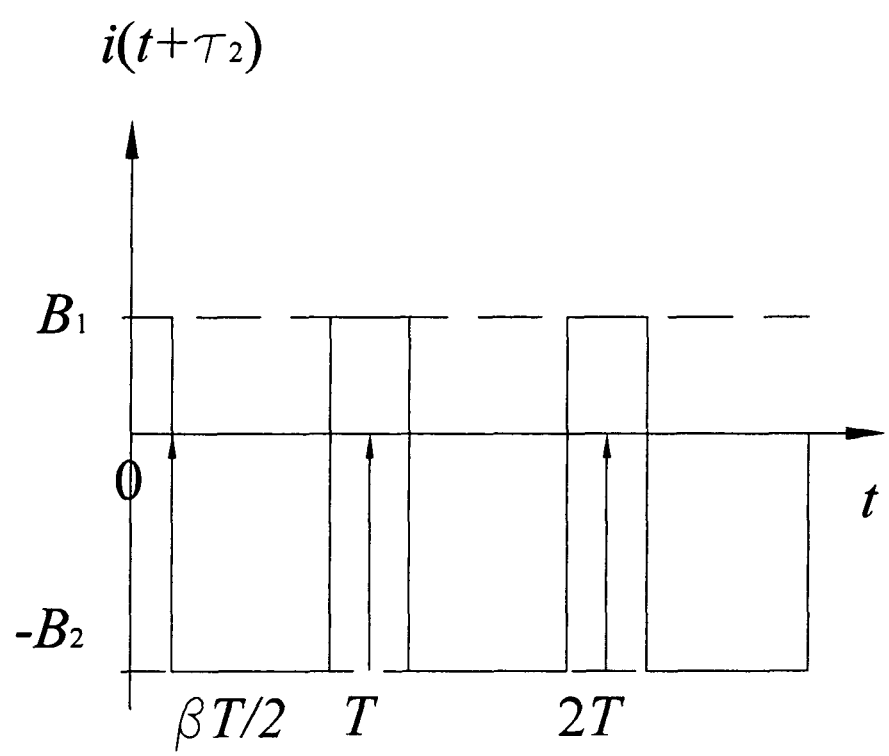
FIG. 9 shows a first asymmetric output signal for an optimized realization (oN-LACE) of the N-LACE of FIG. 3A.

In the limit of large $AK_0$—i.e. in the large-signal regime—$i(t+\tau_2)$ tends to an asymmetric square wave with fundamental frequency component $\omega_0$ as depicted in FIG. 9. Thus, the Fourier series describing $i(t+\tau_2)$ is of the form $$i(t+\tau_2) = b_0 + \sum_1^\infty b_m \cos m\omega_0(t+\tau_2) \, m = 1, 2, 3, \ldots \tag{25}$$

with coefficients $$b_0 = \beta(B_1 + B_2) - B_2, \tag{26a}$$

$$b_m = \frac{2(B_1 + B_2)}{m\pi}\sin(m\beta\pi). \tag{26b}$$

Figure 10:
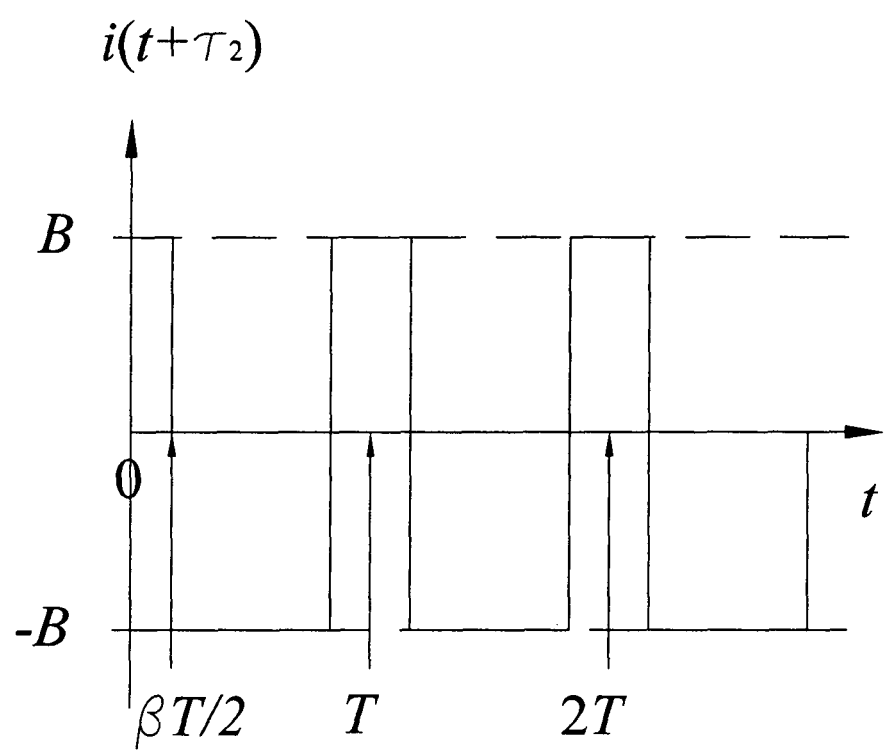
FIG. 10 shows a second asymmetric output signal for an optimized realization (oN-LACE) of the N-LACE of FIG. 3A.

For the limiting case as $AK_0 \to d$ where $d \gg B$ and $\alpha \to 0$, the power in the signal $i(t+\tau_2)$ at the fundamental frequency $\omega_0$ is given by $$P_0 = \left(\frac{2(B_1+B_2)}{\pi}\right)^2 \sin^2(\beta\pi), \tag{27}$$

which for $B_1 = B_2 = B$(FIG. 10) reduces to $$P_0 = \left(\frac{4B}{\pi}\right)^2 \sin^2(\beta\pi). \tag{28}$$

To summarize the properties of the optimal non-linear amplitude control element that is preferably employed in the DLSO 10 of embodiments of the present invention, it features three distinct signal regimes: a small-signal or quasi-linear regime (SS), a transitional signal regime (T) and a large-signal strongly non-linear regime (LS). In assessing the performance of a general non-linear amplitude control element 70 there are four key parameters to consider:

I. The small-signal dynamic gain at time $t_1$:

$$g_{dSS}(t_1) = \left.\frac{\partial i(t_1+\tau)}{\partial v(t_1)}\right|_{SS}$$

where $\tau$ is a time delay characteristic of the input-out conversion in the N-LACE 70, which may or may not be frequency dependent.

II. The linearity of the small-signal quasi-linear regime.

III. The width of the transitional regime (T)—i.e. the range of input signal amplitudes for which the oN-LACE response would be described as transitional.

IV. The large-signal dynamic gain at time $t_1$:

$$g_{dLS}(t_1) = \left.\frac{\partial i(t_1 + \tau)}{\partial v(t_1)}\right|_{LS}$$

where τ is as previously defined.

In the most preferred embodiment of the oN-LACE 70, the control circuitry dynamic gain (I) takes a large constant value which may or may not be dependent on the polarity of the input signal (12); the small-signal quasi-linear signal regime is approximately entirely linear (II), the transitional regime (T) (III) is so narrow as to be negligible, and the large-signal dynamic gain (IV) is zero.

FIG. 5 illustrates such an oN-LACE input-output characteristic for which the small-signal dynamic gain is $K_0$, independent of the polarity of the input signal v(t) and the positive and negative amplitude thresholds have equal magnitude B. However, non-linear amplitude control elements with characteristics other than those shown in FIG. 5 are also contemplated.

Figures 11A, 11B:
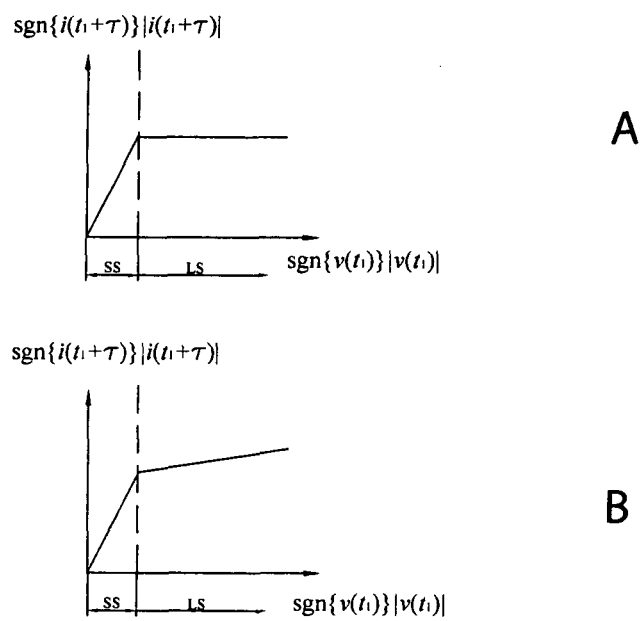
FIG. 11A shows an idealised small and large signal input-output characteristic of an optimized realization (oN-LACE) of the N-LACE of FIG. 3A.
FIGS. 11B-11D show different less optimal input-output characteristics thereof.

The family of non-linear amplitude control element input-output characteristics that fall within the oN-LACE definition are illustrated in FIGS. 11A-11D. FIGS. 11A-11D show only the oN-LACE 70 input-output characteristic for positive values of instantaneous input signal $v(t_1)$. Note that the relative polarities of the oN-LACE input and output signals are arbitrarily defined. In general, the input-output characteristics may be symmetric in $v(t_1)$, anti-symmetric in $v(t_1)$, or entirely asymmetric in $v(t_1)$. FIG. 11A shows an 'ideal' input-output characteristic—this is entirely equivalent to the section of the graph of FIG. 5, for positive $v(t_1)$—the small-signal quasi-linear signal regime (SS) is approximately entirely linear, the transitional regime (T) is so narrow as to be negligible, and the large-signal dynamic gain (IV) is zero. FIG. 11B shows an oN-LACE input-output characteristic, less favourable than the ideal characteristic of FIG. 11A though still representing an advantageous arrangement of oN-LACE 70 suitable for use in the context of a DLSO 10 embodying the present invention. Here, the small-signal quasi-linear signal regime (SS) is—as in the ideal case—approximately entirely linear, and the transitional regime (T) is so narrow as to be negligible. However, there is a non-zero large-signal dynamic gain. Although non-zero, this large-signal dynamic gain is very much smaller than the small-signal dynamic gain i.e. $g_{dSS} \gg g_{dLS}$.

Figure 11C:
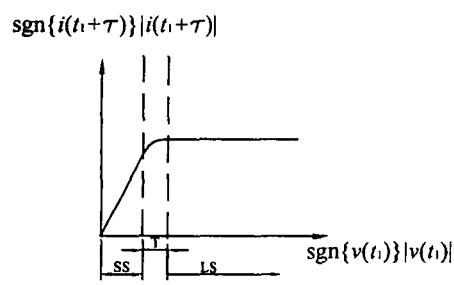

FIG. 11C shows another oN-LACE input-output characteristic, which is likewise less favourable than the ideal characteristic of FIG. 11A but nonetheless still advantageous in the context of a DLSO device embodying the present invention. Here, the small-signal quasi-linear signal regime (SS) is—as in the ideal case—approximately entirely linear and the large-signal dynamic gain is approximately zero. However, there is a transitional regime (T) of finite width separating the small-signal quasi-linear (SS) and control circuitry (LS) regimes. In this transitional region, the behaviour of the oN-LACE is neither quasi-linear nor strongly non-linear.

Figure 11D:
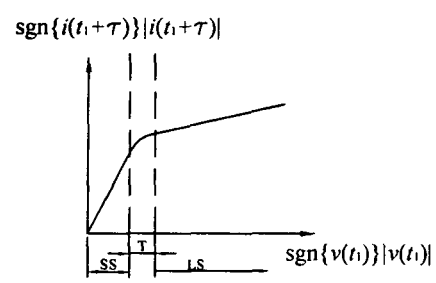

FIG. 11D shows yet another oN-LACE input-output characteristic, which is likewise less favourable than the ideal characteristic of FIG. 11A but nonetheless still advantageous in the context of a DLSO device embodying the present invention. Here, the small-signal quasi-linear signal regime (SS) is—as in the ideal case—approximately entirely linear. However, there is a transitional regime (T) of finite width separating the small-signal quasi-linear (SS) and control circuitry (LS) regimes. In this transitional region, the behaviour of the oN-LACE is neither quasi-linear nor strongly non-linear. Additionally, there is a non-zero large-signal dynamic gain. Although non-zero, this large-signal dynamic gain is very much smaller than the small-signal dynamic gain i.e. $g_{dSS} \gg g_{dLS}$.

Other oN-LACE input-output characteristics are possible that are less favourable than the ideal characteristic of FIG. 11A but still provide advantages in the context of a DLSO device embodying the present invention. For example, a slight non-linearity in the small-signal quasi-linear signal regime may be tolerated, as might a slight non-linearity in the large-signal regime. Combinations of slight non-idealities not explicitly described here are also permissible, for example: in a given oN-LACE characteristic there may be observed a slight non-linearity in the small-signal quasi-linear regime (SS), a narrow but non-negligible transitional region (T) and a small but non-zero large-signal dynamic gain $g_{dLS}$ etc.

Figure 11E:
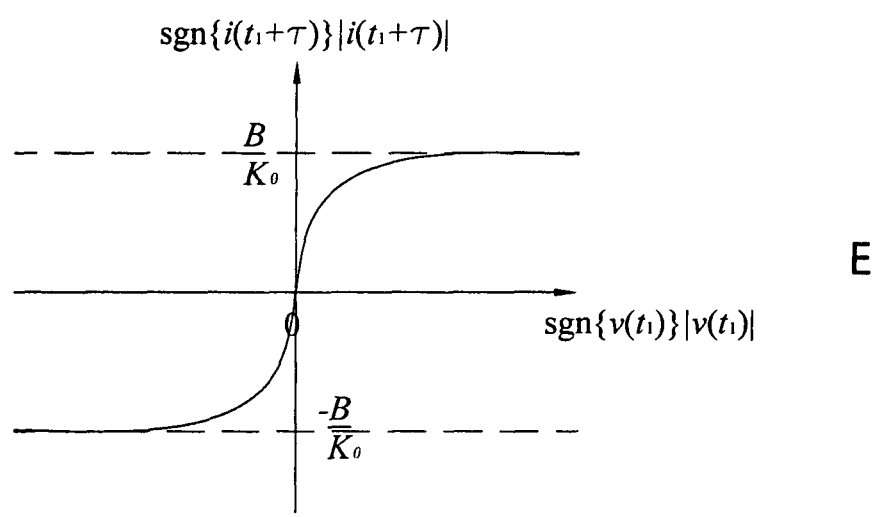
FIG. 11E shows an almost ideal small and large signal input-output characteristic of an oN-LACE employing analogue semiconductor components.
Figure 12:
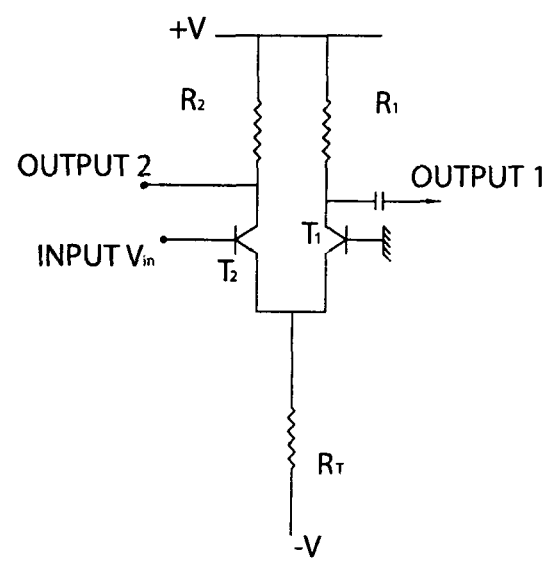
FIG. 12 shows a circuit diagram exemplifying one optimized (oN-LACE) implementation of the N-LACE of FIG. 3A.
Figure 13:
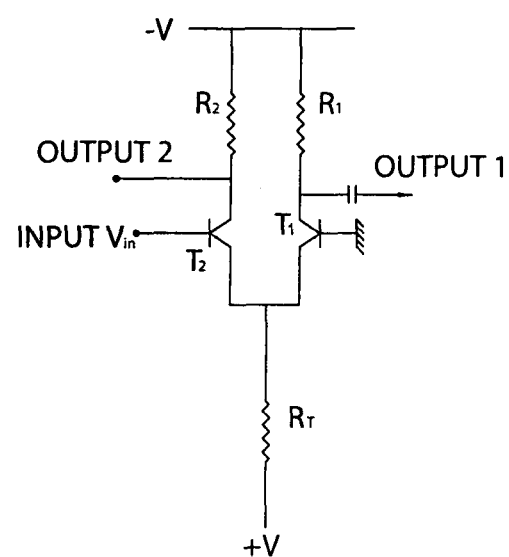
FIG. 13 shows a circuit diagram exemplifying a further optimized (oN-LACE) implementation of the N-LACE of FIG. 3A.

In a particular realization of the oN-LACE using analogue semiconductor components (such as is shown in FIGS. 12 and 13 and described below, for example), an input-output device characteristic of the form $i(t+\tau_2) = k_1 \tan h(k_2 v(t+\tau_1))$ is achieved where $k_1$ and $k_2$ are constants. Such a characteristic is shown in FIG. 11E and has the characteristics of an almost ideal oN-LACE: the small-signal quasi-linear signal regime is approximately entirely linear, the transitional regime (T) is very narrow, and the large-signal dynamic gain (IV) is zero.

Figure 11F:
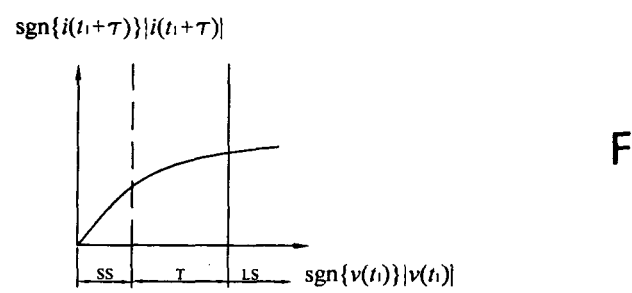
FIG. 11F shows the small and large signal input-output characteristics of a non-linear amplitude control element which has undesirable characteristics.

FIG. 11F shows a non-optimized N-LACE input-output characteristic which would not be preferred. Here, the small-signal (SS) regime differs considerably from the ideal, linear characteristic, the transitional regime (T) is wide such that one could not describe the transition from small-signal (SS) to large-signal (LS) regimes as 'abrupt' but might rather refer to it as 'gradual'. The large-signal dynamic gain is also non-zero and the large-signal input-output response has some non-linearity. Such a non-optimized N-LACE characteristic would not support optimally rapid oscillator stabilization, frequency tracking (see description of "mode-tracking" applications later) or optimal immunity to noise/disturbance.

In the most general sense, there are two different ways in which non-linear amplitude control functionality may be achieved. The first type of non-linear amplitude control incorporates a discrete active element or an arrangement of discrete active elements which may be electrical, electromagnetic or magnetic in nature and which provide a negative differential conductance or transconductance (ie, gain) and a non-linearity. The non-linearity, and, in the majority of cases part or all of the gain, are each provided by a physical, non-linear process which is an inherent property of one or more of the active elements.

The functionality of the second type of non-linear amplitude controller is entirely equivalent to that of the first, but here, the non-linearity is provided not by an inherent physical non-linear process, but by deliberately arranging active elements so that the desired non-linear behaviour is promoted. One way of doing this is, for example, to exploit the gain saturation of an operational amplifier, or to use a transistor pair, as exemplified in FIGS. 12 and 13.

In both types of non-linear amplitude controller, the provision of gain and the provision of non-linearity may be considered as two independent functional requirements, which might accordingly be provided by two distinct functional blocks. In practice, the gain-non-linearity combination is often most readily achieved by exploiting the properties of a single collection of components. In any event, at least conceptually, the non-linearity may be considered as being superimposed on top of a linear gain characteristic, to create the desired set of input-output characteristics.

Considered in this way, the key function of the non-linearity is then to limit the maximum value of the gain (or the transconductance, or simply the output signal) of the overall amplitude regulator circuitry. Overall, the intention is that the combination of the "gain" functionality and the "non-linear" functionality provides a unit which delivers a significant gain for small signals, that has a constant magnitude output once the input exceeds a pre-determined threshold, as explained above.

FIGS. 12 and 13 show two simple exemplary circuits suitable for providing the desirable characteristics of an oN-LACE 70 as outlined above. Each circuit is of the second type of non-linear amplitude control described above, that is, each provides a circuit induced non-linearity provided by a pair of bipolar junction transistors. In the case of the arrangement of FIG. 12 the bipolar junction transistors are NPN, whereas in the case of FIG. 13 PNP transistors are employed.

Looking first at FIG. 12 a first embodiment of an oN-LACE is shown. The arrangement of FIG. 12 employs first and second NPN transistors $T_1$ and $T_2$, arranged as a long-tailed pair differential amplifier. The amplifier 50 (FIG. 3) provides an input voltage $V_{in}$ to the base of transistor $T_2$. The base of transistor $T_1$ is grounded. The collector of transistor $T_1$ is connected to a positive voltage rail +V via a first resistor $R_1$, and a collector of the second transistor $T_2$ is connected to the same positive voltage rail via a second resistor $R_2$. The emitters of each transistor $T_1$, $T_2$ are connected in common to a negative voltage rail −V via a tail resistor $R_T$.

The collector of the first transistor $T_1$ is capacitively coupled to a delay-line arrangement 20. Thus the circuit of FIG. 12 provides an amplified and regulated version of the circuit input to the base of transistor $T_2$ to drive the delay-line arrangement 20. In addition, this current regulated output from the collector of the first transistor $T_1$ may be connected to the frequency counter 80 (FIG. 3) to provide a frequency output.

The collector of the second transistor $T_2$ provides a second circuit output to the peak detector/demodulator 90 (see FIG. 3 again). This output from the collector of the second transistor $T_2$ is an AC signal at the frequency of the input signal $V_{in}$ with an amplitude proportional to that input voltage. This input level dependent signal, when demodulated by the demodulator 90, recovers a DC signal which is proportional to the input level. This DC signal may for example be employed to monitor changes in the quality factor (Q) of a delay-line arrangement resonance. More specific details of this use of the demodulator output are set out below, where some examples of particular implementations of the DLSO 10 embodying the present invention are described.

FIG. 13 shows an alternative circuit arrangement to that of FIG. 12. The configuration is identical save that the transistors $T_1$ and $T_2$ are, in FIG. 13, PNP transistors, and the voltage rails are thus reversed.

In each case of the circuit arrangements of FIGS. 12 and 13, for small amplitudes of input, injecting a signal at the base of the second transistor $T_2$ results in a proportional current flow in the collector of the first transistor $T_1$. This is the linear regime of the oN-LACE and is provided via the small-signal "linear gain" regime of the transistor pair. Once the input reaches a certain threshold value, the first transistor $T_1$ is instantaneously driven "fully on", and its collector current accordingly saturates at a predetermined value. This provides the "strongly non-linear" characteristic of the oN-LACE.

In each of the circuits of FIGS. 12 and 13, the collector current of the second transistor $T_2$ varies with the voltage amplitude of the input signal for all values of input. Demodulation of this signal by the demodulator 90 provides, therefore, a means to monitor the amplitude of the input to the circuit.

Having set out the principles underlying embodiments of the present invention, some examples of practical devices employing these principles will now be described.

Any delay-line arrangement operating in the electrical, electromagnetic or magnetic domain may be reduced to an equivalent two-port electrical network (or arrangement of such networks). The voltage and current, or effective voltage and current at any point along a delay-line arrangement 20 comprising at least one delay-line is conveniently described using transfer function matrices. Such transfer function matrices may be manipulated either by hand or by computer using a numerical technique in order to solve for the resonance and anti-resonance frequencies of a given delay-line arrangement 20.

FIGS. 14 and 15 are block schematic diagrams of several example DLSOs 10 realized in conjunction with a selection of simple delay-line arrangements 20. Such DLSOs 10 may be realized in conjunction with any type or types of delay-line (s). FIG. 3014A illustrates an arrangement incorporating a delay-line arrangement 20 as previously described: a single length of delay-line 200, terminated by an element 210 with impedance $Z_L(j\omega)$ connected to the control circuitry 30 via a frequency selection impedance $Z(j\omega)$ 220.

Figures 14A, 14B, 14C:
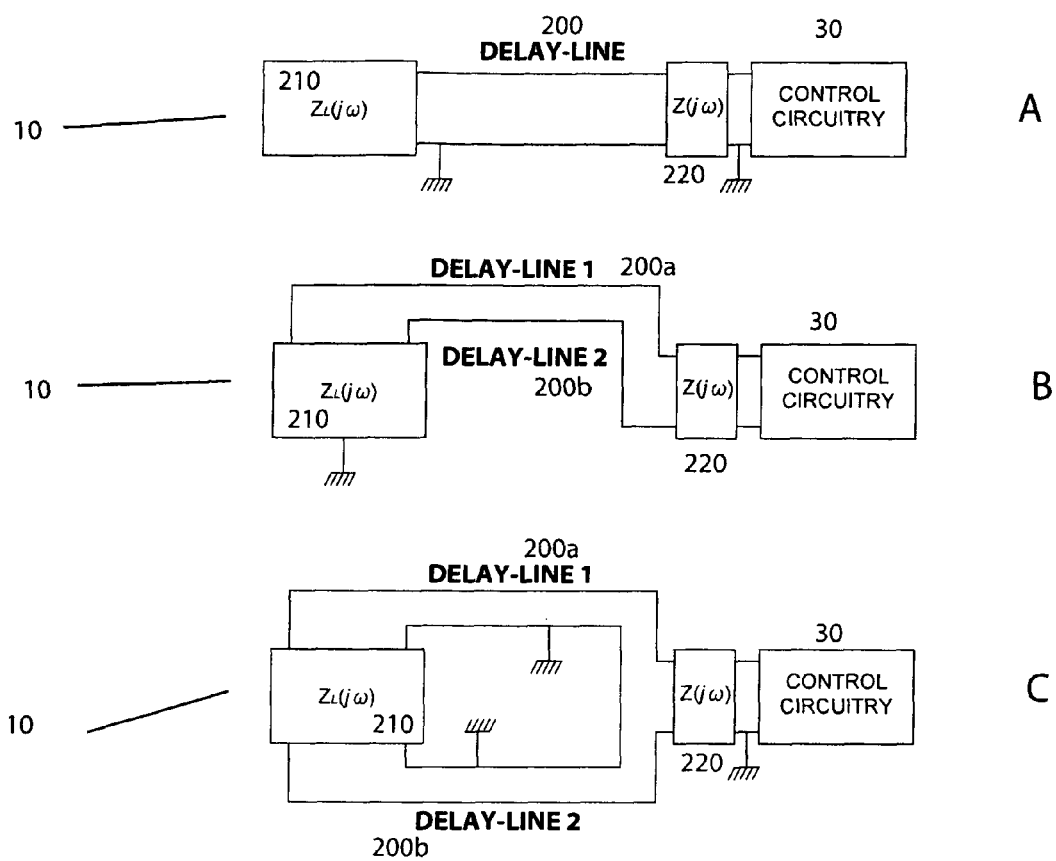
FIGS. 14A, 14B, 14C, 15A and 15B show alternative embodiments of DLSOs in accordance with the present invention and including delay-line arrangements.

FIG. 14B shows a DLSO 10 realization in which two delay-lines 200a, 200b are separately connected to the control circuitry 30 and an element 210 appears between an earth connection signal lines. As with the arrangement of FIG. 14A, the control circuitry 30 is connected to the first and second delay-lines 200a, 200b via a frequency selection impedance $Z(j\omega)$ 220.

FIG. 14C shows an alternative arrangement in which an element 210 appears in series with two delay-lines 200a, 200b separately connected to the control circuitry 30 via a frequency selection impedance $Z(j\omega)$ 220.

Figures 15A, 15B:
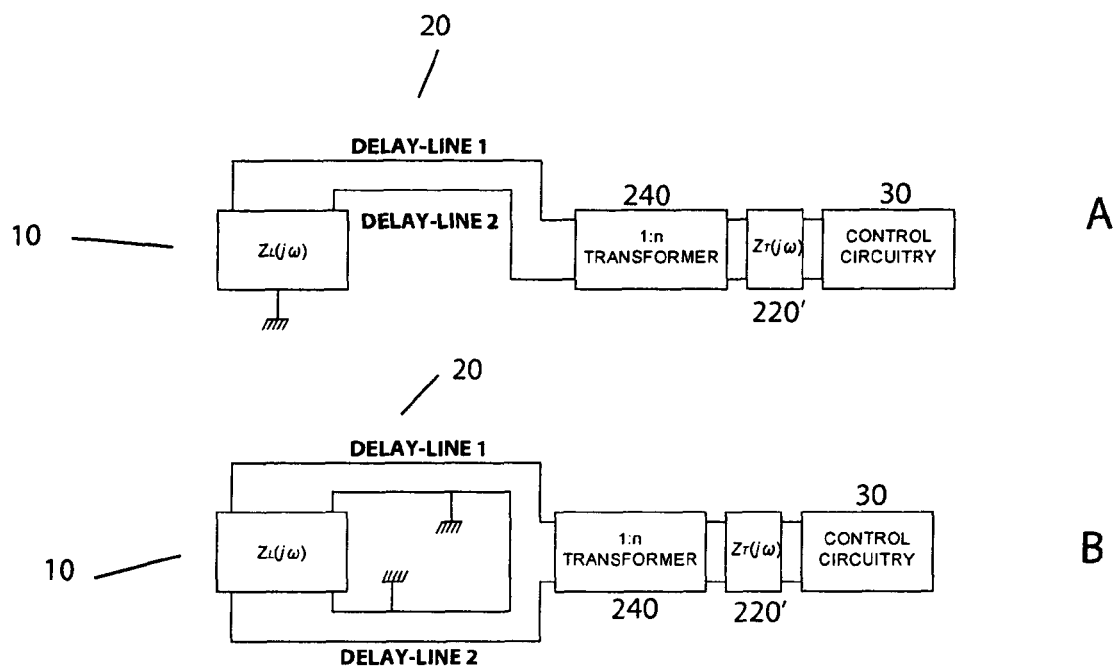

FIG. 15A shows a further possible arrangement in which, rather than being directly connected to the control circuitry 30 via the frequency selection impedance $Z(j\omega)$ 220 of FIG. 14B, the delay-line arrangement 20 is connected to the control circuitry 30 via a 1:n transformer 240. In this case, the frequency selection impedance $Z_T(j\omega)$ 220' is 'transformed' by the transformer 240 and thus the combination of the transformer 240 and the impedance $Z_T(j\omega)$ 220' present some impedance $Z_{T*}(j\omega)$ which is the frequency selection impedance.

In the alternative system of FIG. 15B, the delay-line arrangement 20 of FIG. 14C is connected to the control circuitry 30 via a 1:n transformer 240. In this case, the frequency selection impedance $Z_T(j\omega)$ 220' is 'transformed' by the transformer 240 and thus the combination of the transformer and the impedance $Z_T(j\omega)$ 220' present some impedance $Z_{T*}(j\omega)$ which is the frequency selection impedance.

Figure 16:
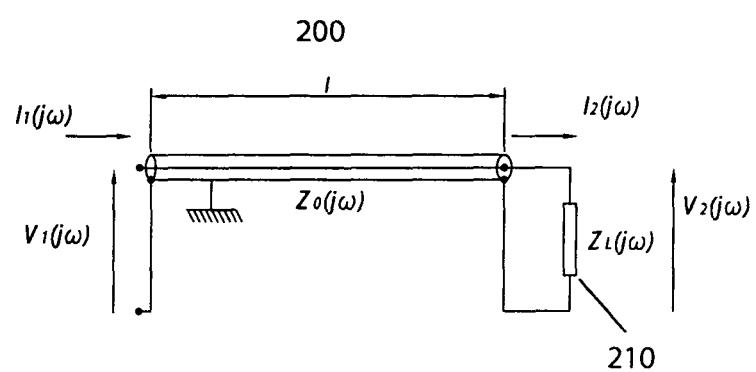
FIGS. 16 and 17 show delay-line arrangements suitable for the DLSOs of FIG. 14A.
Figure 17:
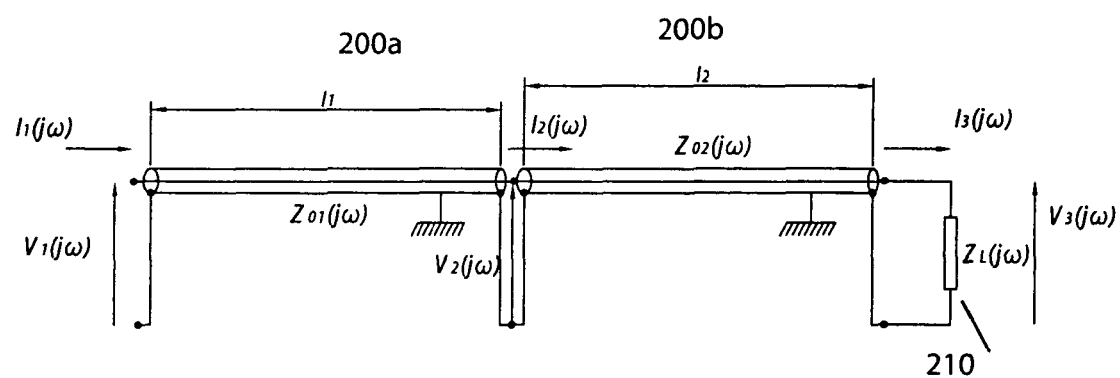

FIGS. 16 and 17 illustrate delay-line arrangements relevant to the DLSO system of FIG. 14A. FIG. 16 shows a single length of delay-line 200, of length l, characteristic impedance $Z_0(j\omega)$ connected to an element 210 with impedance $Z_L(j\omega)$.

FIG. 17 shows two lengths of delay-line: delay-line 1 200a with length $l_1$, characteristic impedance $Z_{01}(j\omega)$, propagation coefficient $\gamma_1$ and delay-line 2 200b, with length $l_2$, characteristic impedance $Z_{02}(j\omega)$, propagation coefficient $\gamma_2$, connected to an element 210 with impedance $Z_L(j\omega)$.

Figures 18A, 18B:
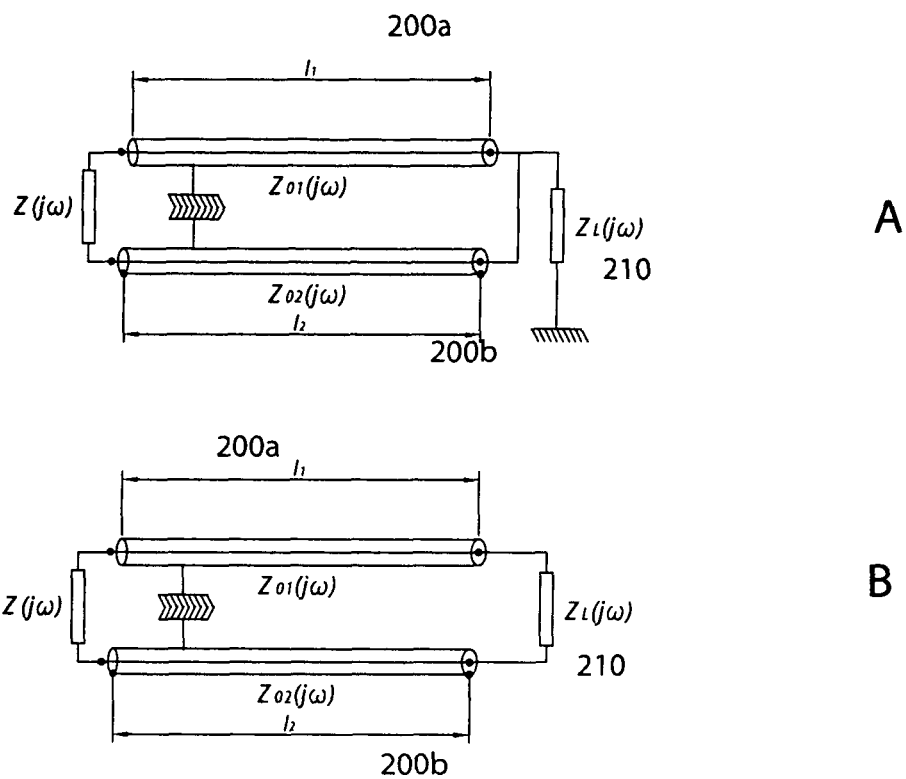
FIGS. 18A and 18B show delay-line arrangements suitable for the DLSOs of FIGS. 14B and 14C FIGS. 19A and 19B show delay-line arrangements suitable for the DLSOs of FIGS. 15A and 15B respectively.

FIG. 18 illustrates particular delay-line arrangements 20 in combination with frequency selection impedances relevant to the DLSOs 10 of FIGS. 14B and 14C. FIG. 18A shows two lengths of delay-line line: delay-line 1 200a with length $l_1$, characteristic impedance $Z_{01}(j\omega)$, propagation coefficient $\gamma_1$ and delay-line 2 200b with length $l_2$, characteristic impedance $Z_{02}(j\omega)$, propagation coefficient $\gamma_2$, connected to a shunt element 210 with impedance $Z_L(j\omega)$. FIG. 18B shows two lengths of delay-line line—delay-line 1 200a with length $l_1$, characteristic impedance $Z_{01}(j\omega)$, propagation coefficient $\gamma_1$ and delay-line 2 200b with length $l_2$, characteristic impedance $Z_{02}(j\omega)$, propagation coefficient $\gamma_2$ connected in series with an element 210 with impedance $Z_L(j\omega)$.

Figures 19A, 19B:
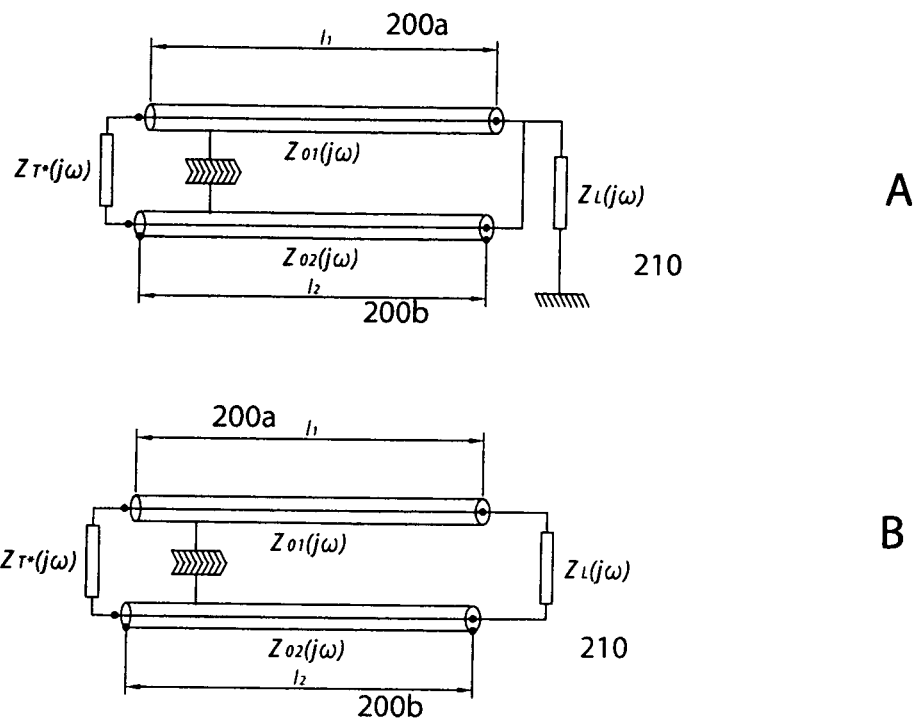

FIG. 19A illustrates a delay-line arrangement 20 in combination with a frequency selection impedance relevant to the DLSO of FIG. 15A. The delay-line arrangement of FIG. 19A incorporates two lengths of delay-line line: delay-line 1 200a with length $l_1$, characteristic impedance $Z_{01}(j\omega)$, propagation coefficient $\gamma_1$ and delay-line 2 200b with length $l_2$, characteristic impedance $Z_{02}(j\omega)$, propagation coefficient $\gamma_2$, connected to a shunt element with impedance $Z_L(j\omega)$ 210. The delay-lines are connected to the control circuitry via an impedance $Z_{T*}(j\omega)$ which is the transformed impedance $Z_T(j\omega)$.

FIG. 19B illustrates a delay-line arrangement 20 in combination with a frequency selection impedance relevant to the DLSO FIG. 15B. The delay-line arrangement of FIG. 19B incorporates two lengths of delay-line line: delay-line 1 200a with length $l_1$, characteristic impedance $Z_{01}(j\omega)$, propagation coefficient $\gamma_1$ and delay-line 2 200b with length $l_2$, characteristic impedance $Z_{02}(j\omega)$, propagation coefficient $\gamma_2$, connected in series with an element 210 with impedance $Z_L(j\omega)$. The delay-lines 200a, 200b are connected to the control circuitry 30 via an impedance $Z_{T*}(j\omega)$ which is the transformed impedance $Z_T(j\omega)$ 220'.

A given implementation of the DLSO is designed to exploit the frequency response characteristics of a given delay-line arrangement 20 (e.g. FIG. 2) for a particular purpose e.g. to make a measurement, carry information or to arrange that a particular piece of control circuitry is substantially insensitive to a known noise source or signal.

Any combination of delay-line arrangement 20 and frequency selection impedance embodying the present invention may be described in terms of an effective impedance $Z_{in}(j\omega)$ presented to the control circuitry 30. Implementations of the DLSO 10 divide into two categories: Type A DLSOs are designed to operate the delay-line arrangement 20 at one of its characteristic resonance or anti-resonance frequencies i.e. one of the frequencies at which the magnitude of the effective input impedance $Z_{in}(j\omega)$ is either minimum or maximum. Type B DLSOs are designed in such a way as to operate the delay-line arrangement 20 which is at a frequency neither co-incident with a characteristic resonance frequency of the delay-line arrangement 20 nor co-incident with an anti-resonance frequency of the delay-line arrangement but instead co-incident with some other resonance or anti-resonance frequency determined by the combination of the delay-line arrangement 20 effective input impedance $Z_{in}(j\omega)$ and the frequency selection impedance $Z(j\omega)$ (e.g. a resonance frequency of a combined system comprising the delay-line arrangement 20 and the frequency selection impedance $Z(j\omega)$).

Typically $Z_{in}(j\omega)$ is characterised by not one but a multiplicity of resonance frequencies. Thus there is required in Type A realizations of the DLSO 10 a means to select a 'strongly-preferred mode'—i.e. to promote robust operation of the DLSO 10 at a single particular resonance or anti-resonance frequency. In Type B realizations of the DLSO 10 there is furthermore required a means to promote operation of the DLSO 10 at some single advantageous resonance or anti-resonance frequency $\omega_B$. In both Type A and Type B DLSOs, modal selectivity may be achieved by several techniques. Two such techniques are discussed below.

Modal Selectivity Via Frequency Selection Impedance or Frequency Selection Impedance Stage Design In this technique modal selectivity is achieved by combining an appropriately designed frequency selection impedance with a given delay-line arrangement 20.

Figure 20:
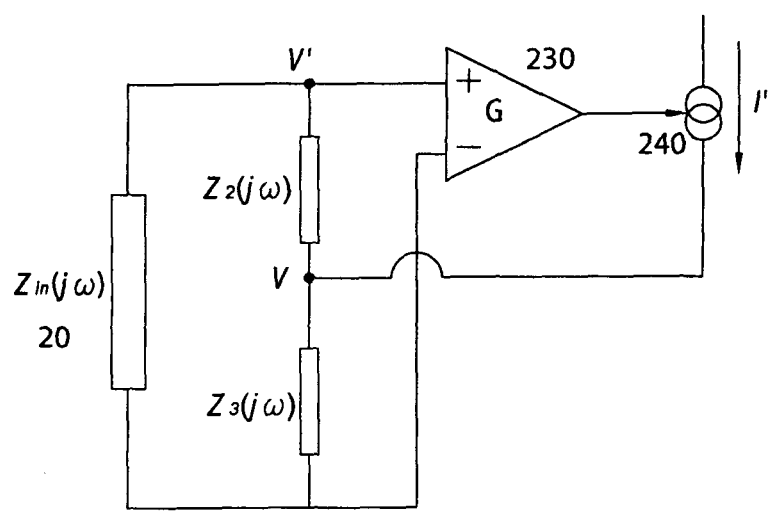
FIG. 20 shows one mode-selective feedback configuration of a DLSO in accordance with an embodiment of the present invention.

FIG. 20 shows a possible mode-selective feedback configuration in the context of the DLSO 10. The delay-line arrangement 20 is represented by the equivalent frequency dependent impedance $Z(j\omega)$. The frequency selection impedance stage which is the input stage to the control circuitry 30 comprises two purely imaginary frequency dependent impedances $Z_2(j\omega)$ and $Z_3(j\omega)$ in combination with an amplifier 230 and current source 240. The impedances $Z_2(j\omega)$ and $Z_3(j\omega)$ may comprise or incorporate one or a combination of electronic, electromagnetic or magnetic elements. The combination of the amplifier 230 and the two frequency dependent impedances together present a certain impedance to the delay-line arrangement 20. This impedance is the frequency selection impedance $Z(j\omega)$. The current source 240 provides an amplitude regulated current (or effective current) with some amplitude I' as indicated in FIG. 20 and the combination of the current source 240 and amplifier 230 are equivalent to the amplifier 50, driver 60 and N-LACE components 70 shown in FIG. 3A. It can be shown that the conditions for self-oscillation of the schematic system of FIG. 20 may be met if the transconductance $$g_m = \frac{I'}{V}$$

obeys $$g_m \geq \frac{r}{Z_3(j\omega)(Z_3(j\omega) + Z_2(j\omega))}. \tag{29}$$

where r is the loss equivalent resistance presented by $Z_{in}(j\omega)$. Accordingly a figure of merit may be defined:

$$f(j\omega) = Z_3(j\omega)(Z_3(j\omega) + Z_2(j\omega)). \tag{30}$$

Figure 21:
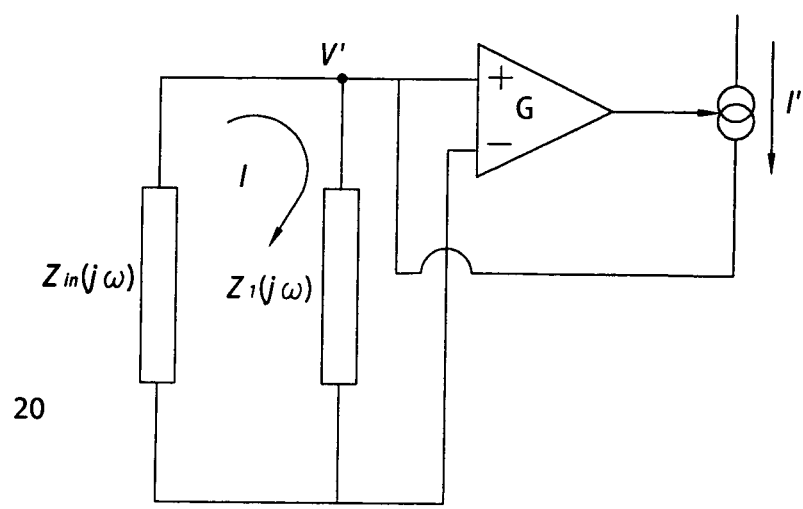
FIG. 21 shows an alternative mode-selective feedback configuration of a DLSO in accordance with an embodiment of the present invention.

If there are a number of possible operating modes defined by the frequency response characteristics of $Z_{in}(j\omega)$ which satisfy (29), the modes corresponding to the highest positive value of $f(j\omega)$ will be favoured. Moreover, since the transconductance $g_m$ and r are necessarily a positive quantities, certain modes may be excluded entirely by for example, selecting a combination of $Z_2(j\omega)$ and $Z_3(j\omega)$ such that $f(j\omega)$ has a negative value at these frequencies. FIG. 21 shows a further example of a feedback scheme. In this case the condition on the transconductance $$g_m = \frac{I'}{V}$$

for viable amplitude-stable self-oscillation is $$g_m \geq \frac{r}{Z_1^2(j\omega)} \quad (31)$$

and thus the figure of merit in this case is given by $$f(j\omega) = Z_1^2(j\omega). \quad (32)$$

Figure 22:
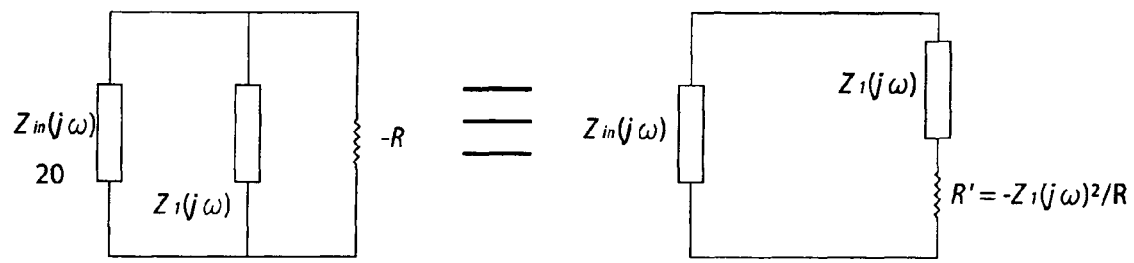
FIG. 22 shows an equivalent circuit for the arrangement of the DLSO of FIG. 21.

The system of FIG. 21 is equivalent to those shown in FIG. 22 where the combination of the imaginary component of the delay-line arrangement 20 impedance $Z_{in}(j\omega)$ and the imaginary impedance $Z_1(j\omega)$ define the operating mode of the oscillator (i.e. this system represents a realization of a Type B DLSO) and –R is a large negative resistance which compensates for the loss in the delay-line system.

Figure 23:
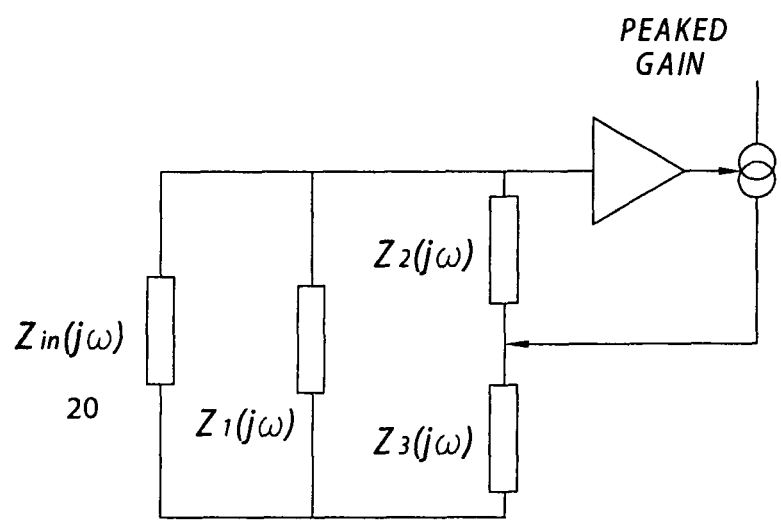
FIG. 23 shows an alternative mode-selective feedback configuration of a DLSO in accordance with an embodiment of the present invention.
Figure 24:
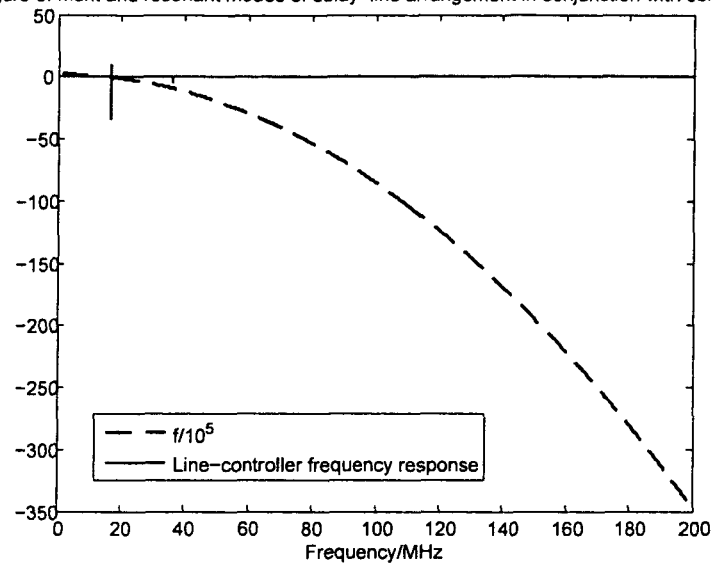
FIG. 24A shows the characteristics of an arrangement of FIG. 20.
FIG. 24B shows a part of FIG. 24A in close up.
Figure 24:
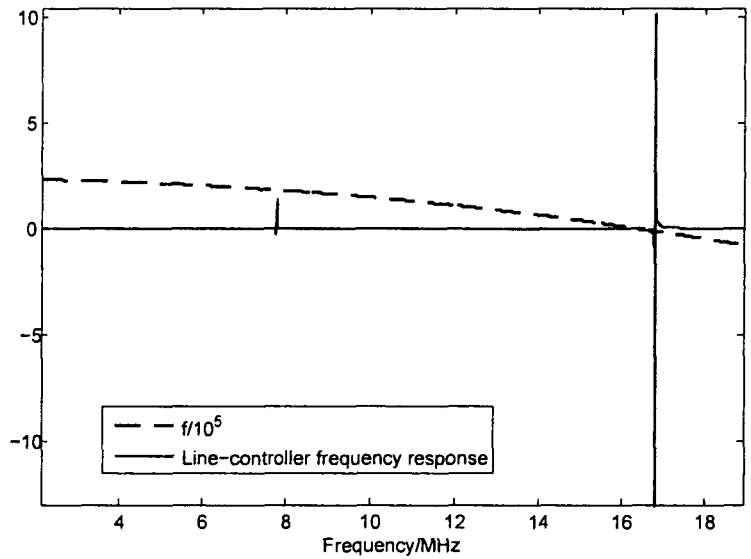

FIG. 23 shows a general mode-selective feedback configuration comprising in addition to the delay-line arrangement 20, four system variables the presence or value of which is determined by the particular requirements of the DLSO: three (generally imaginary) impedances $Z_1(j\omega)$, $Z_2(j\omega)$ and $Z_3(j\omega)$ and the presence or otherwise of an amplifier peaked gain characteristic. The impedances $Z_1(j\omega)$, $Z_2(j\omega)$ and $Z_3(j\omega)$ may comprise or incorporate one or a combination of electronic, electromagnetic or magnetic elements. Many possible variations of the general system of FIG. 23 are possible, for example: the system of FIG. 20 is equivalent to that of FIG. 23 with $Z_1(j\omega) \to \infty$ and no peaked amplifier gain; the system of FIG. 21 is equivalent to that of FIG. 23 with $Z_2(j\omega)=Z_3(j\omega)=0$ and no peaked amplifier gain. For the purposes of illustration, the characteristics of a particular purely electrical implementation of the scheme of FIG. 20 with the parameters shown in Table 2 are shown in FIG. 24. The electrical delay-line arrangement 20 is identical to that specified in Table 1. The (electrical) impedances $Z_2(j\omega)$ and $Z_3(j\omega)$ as indicated in FIG. 20 are as specified in Table 2. This arrangement represents a Type B DLSO. The solid line in each plot is of the combined delay-line arrangement-frequency selection impedance inverse frequency response between 0 and 200 MHz. The peaks in these solid lines correspond to resonant modes—i.e. potential operating modes of the DLSO. Anti-resonant modes are not shown. The lowest visible peak, between 7 and 8 MHz (FIG. 24B) is the lowest resonant operating mode of the DLSO. The dotted lines in each plot are of the figure of merit $f(j\omega)$ (30). The magnified view of FIG. 24B shows the region of FIG. 24A between 3 and 18.5 MHz. With this particular arrangement FIG. 24B illustrates that the low frequency mode is selected ($f(j\omega)$ positive) over the high frequency mode which is precluded since at this frequency $f(j\omega)$ takes a negative (infeasible) value.

TABLE 2

| Parameter | Symbol | Value |
|---|---|---|
| Impedance 2 | $Z_2(j\omega)$ | $(10^{12}/j20\omega)$ Ω |
| Impedance 3 | $Z_3(j\omega)$ | $j4.7\omega\mu$ Ω |

Figure 25:
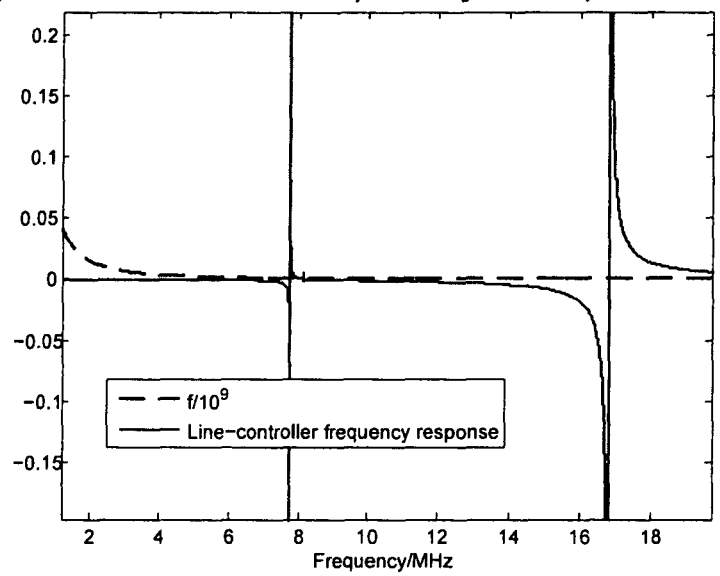
FIG. 25A shows the characteristics of an arrangement of FIG. 21.
FIG. 25B shows a part of FIG. 25A in close up.
Figure 25:
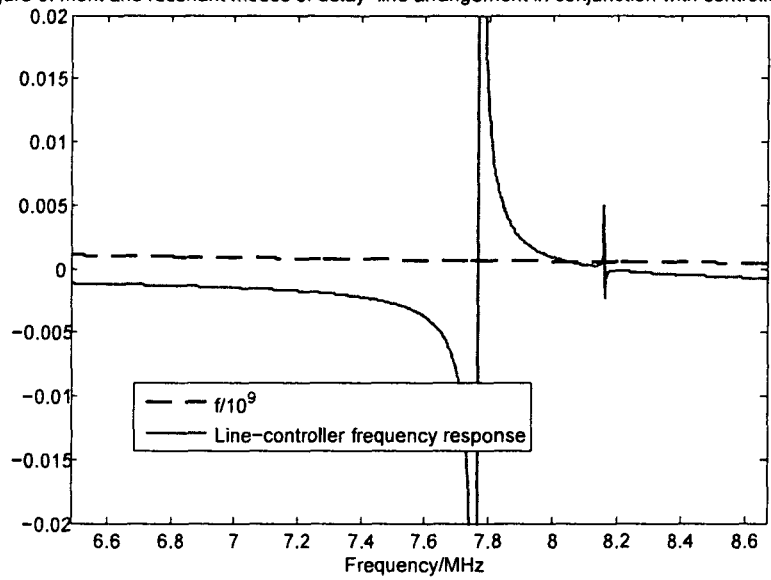

As a further illustration, the characteristics of a particular implementation of the scheme of FIG. 21 are shown in FIG. 25. The delay-line arrangement is identical to that specified in Table 1. The impedance $Z_1(j\omega)=(10^{12}/j20\omega+j4.7\times10^{-6}\omega)$Ω. This system represents a Type B DLSO. The solid lines in the plots are of the combined delay-line arrangement-frequency selection impedance inverse frequency response between 1.5 and 19 MHz. The peaks correspond to resonant modes—i.e. potential operating modes of the DLSO. Anti-resonant modes are not shown. The lowest visible peak is between 7 and 8 MHz and represents the lowest resonant operating mode. The magnified view of FIG. 25B shows the region of FIG. 25A between 6.5 and 8.6 MHz. With this particular arrangement FIG. 25B illustrates that the low frequency mode is selected ($f(j\omega)$ is positive and maximum) over all high frequency modes.

The dotted lines in FIGS. 25A and 25B represent the figure of merit defined by (32).

Modal Selectivity Via Variable Loop Gain

Figure 26:
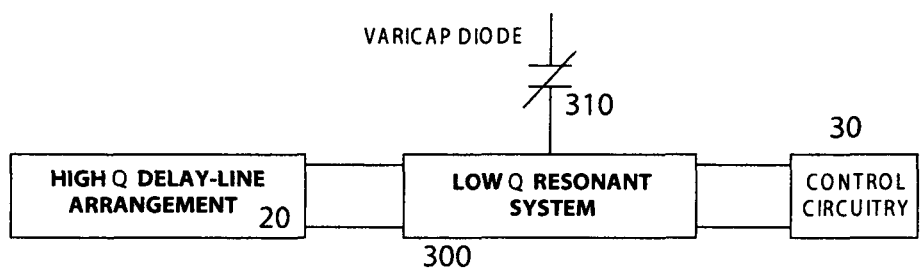
FIG. 26 shows a schematic arrangement of a DLSO in accordance with another embodiment of the present invention.

This alternative mode-stabilization technique is illustrated schematically in FIG. 26. Here, a frequency dependent gain is used to stabilize the desired DLSO operating mode. The loop gain of the closed-loop controlled system is determined by a low Q resonant or anti-resonant system 300 which may for example have a frequency response featuring a single, broad resonant or anti-resonant peak. The location of the broad resonant or anti-resonant peak determines the mode selected. The location of the peak may be determined by a range of methods, including the incorporation of a varicap diode 310 as illustrated in FIG. 26. In the context of embodiments of the present invention, such a mode-stabilization method may be employed in conjunction with Type A or Type B DLSOs. In the case of Type B DLSOs, an additional frequency dependent imaginary impedance is introduced into the control loop such that the combination of this impedance with that of the delay-line arrangement 20 has one or more resonance or anti-resonance frequencies, these resonance and anti-resonance frequencies being potential DLSO operating modes.

As explained above, the particular form of the delay-line arrangement 20, frequency selection impedance and control circuitry 30 may be designed in such a way as to optimize a given DLSO 10 for a particular application. Particular properties of a variety of specific DLSOs will accordingly now be described.

'Time-of-Flight Systems'

DLSOs 10 incorporating a delay-line arrangement 20 featuring one or more delay-lines 200, 200a, 200b connected to the control circuitry 30 in a 'loop' type system have operating frequencies substantially determined by the characteristic length of the incorporated delay-line or lines and thus may be regarded as 'time-of-flight' type DLSOs. Time-of-flight arrangements operating in conjunction with electrical delay-line arrangements feature excellent immunity to microphonic noise, whilst time-of-flight DLSOs incorporating spin-wave (magnetic) delay-line arrangements have applications in—for example—sensing, information processing and data storage.

Figure 27:
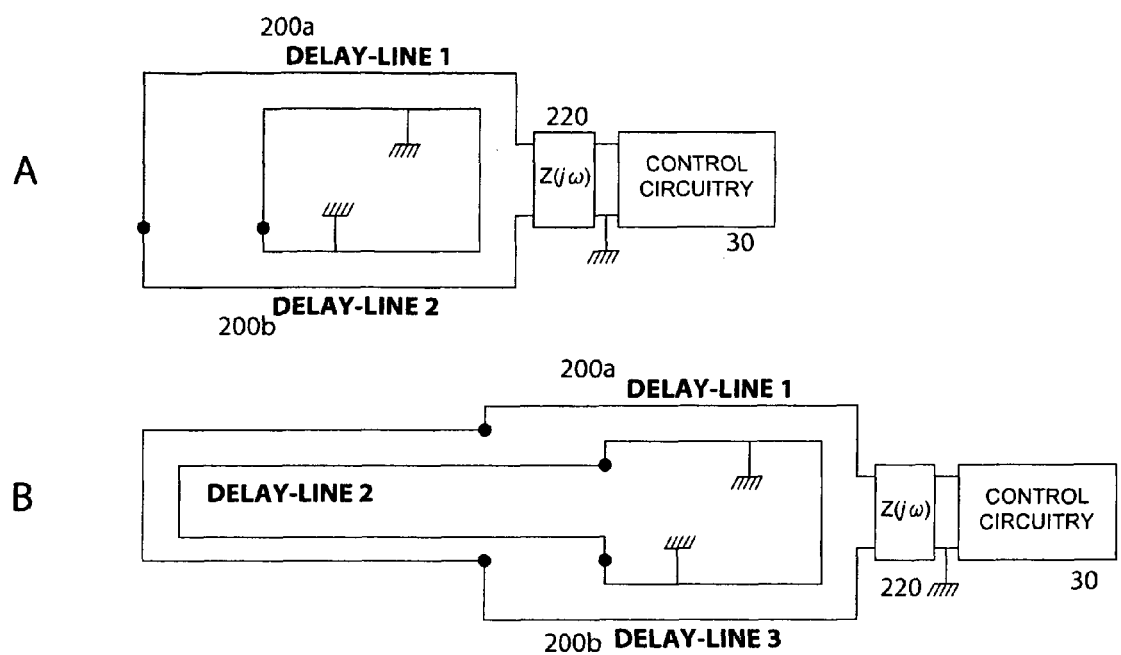
FIGS. 27A and 27B show schematic arrangements of DLSOs in accordance with still other embodiments of the present invention.

Many such time-of-flight type DLSOs are possible. FIGS. 14B, 14C, 15A, 15B show time-of-flight type DLSOs incorporating an element 210 with some impedance $Z_L(j\omega)$. FIG. 27 shows two possible time-of-flight type DLSOs with delay-line arrangements 20 that do not feature additional electrical, electromagnetic or magnetic elements.

Design for Optimal Sensitivity or Optimal Insensitivity

A DLSO may be realized in conjunction with a given delay-line arrangement 20 such that the properties of the oscillator (operating frequency and/or amplitude of oscillation) are substantially sensitive or substantially insensitive to change or changes in the properties of electrical, electromagnetic or magnetic elements that form part of the delay-line arrangement 20. The realization of an optimally sensitive or optimally insensitive DLSO 10 (and the extent to which an optimally sensitive or insensitive DLSO 10 is viable within practical constraints) depends on the requirements and constraints presented by the delay-line arrangement and overall required function of the DLSO.

It has been established that the impedance $Z_{in}(j\omega)$ presented by a given delay-line arrangement 20 exhibits minima and maxima—i.e. there are featured both resonance and anti-resonance frequencies. When operated at one of its characteristic resonance frequencies, the delay-line arrangement presents a small or very small effective (electrical, electromagnetic or magnetic) impedance to the control circuitry 30 whilst if operated at one of its anti-resonance frequencies, the effective impedance presented is large or very large. In general, a DLSO 10 may be realized that embodies the present invention, which is both substantially mode-stable and substantially sensitive to changes in impedance of a given delay-line arrangement (and therefore for example, changes in the impedance of constituent electrical, electromagnetic or magnetic elements) if the delay-line arrangement presents a small effective impedance. Conversely, if the effective impedance presented by the delay-line arrangement is very large, it may be arranged that the DLSO is substantially non-mode stable and substantially insensitive to changes in the properties of the delay-line arrangement. Thus in the context of the present invention, the choice of whether to operate the delay-line arrangement at, or proximal to one of its resonance frequencies or at or proximal to one of its anti-resonance frequencies is dependent on the sensitivity and stability requirements of the instrumentation system.

In certain DLSO implementations, sensitivity is further dependent on the impedance relationship between the delay-lines and incorporated electrical, electromagnetic or magnetic element or elements and the relationship or relationships between the effective overall effective quality factor of the delay-line arrangement $Q_e$, the effective quality factor or quality factors $Q_L$ of the electrical, electromagnetic or magnetic element or elements (where these can be defined) and the unloaded effective quality factor or effective quality factors of the incorporated delay-line or delay-lines Q.

Design for Minimal Interaction in Multiple Oscillator Networks

By realizing DLSOs—DLSOs 1 and 2—with independent delay-line arrangements: respectively delay-line arrangements 1 and 2, such that the operating frequency of DLSO 1, $\omega_1$ is co-incident with or proximal to a resonance frequency of delay-line arrangement 1 whilst being co-incident with or proximal to an anti-resonance frequency of delay-line arrangement 2 and vice-versa i.e. the operating frequency of DLSO 2, $\omega_2$ is co-incident with or proximal to a resonance frequency of delay-line arrangement 2 whilst being co-incident with or proximal to an anti-resonance frequency of delay-line arrangement 1, the two DLSOs may be made substantially independent. Many possible methods of arranging this condition are possible and the technique may be extended to large networks of 'switched-mode' DLSOs (see below). A simple illustrative example of such an arrangement is two DLSOs both incorporating electrical delay-line arrangements of the type shown in FIG. 1. Tables 3 and 4 specify the electrical delay-line arrangements 1 and 2 respectively. Table 5 indicates that if DLSO 1 is operated at $\omega_1$=81.3845 MHz whilst DLSO 2 is operated at $\omega_2$=100.0034 MHz, the impedance presented by the delay-line arrangement 1 to the control circuitry of DLSO 1 at its operating frequency $\omega_1$ is 5 orders of magnitude below the impedance presented by the delay-line arrangement 2 to the control circuitry of DLSO 2 at this frequency. Similarly, the impedance presented by the delay-line arrangement 2 to the control circuitry of DLSO 2 at its operating frequency $\omega_2$ is 8 orders of magnitude below the impedance presented by the delay-line arrangement 1 to its control circuitry at this frequency.

TABLE 3

Delay-line arrangement 1

| Parameter | Symbol | Value |
|---|---|---|
| Delay-line length | $l_1$ | 8 m |
| Delay-line char. impedance | $Z_{01}$ | 50 Ω |
| Delay-line phase velocity | $v_{p1}$ | $2 \times 10^8$ ms$^{-1}$ |
| Delay-line termination | $Z_{L1}(j\omega)$ | $[(0.5 + j\omega 10^{-6})^{-1} + j\omega 2.5 \times 10^{-12}]^{-1}$ Ω |

TABLE 4

Delay-line arrangement 2

| Parameter | Symbol | Value |
|---|---|---|
| Delay-line length | $l_2$ | 8.5 m |
| Delay-line char. impedance | $Z_{02}$ | 50 Ω |
| Delay-line phase velocity | $v_{p2}$ | $2 \times 10^8$ ms$^{-1}$ |
| Delay-line termination | $Z_{L2}(j\omega)$ | $[(0.5 + j\omega 10^{-6})^{-1} + j\omega 2.5 \times 10^{-12}]^{-1}$ Ω |

TABLE 5

| Parameter | Frequency/MHz | $|Z_{in}(j\omega)|/\Omega$ |
|---|---|---|
| Delay-line arrangement 1 | 100.0034 | $2.65 \times 10^5$ |
|  | 81.3845 | 0.005 |
| Delay-line arrangement 2 | 100.0034 | 0.007 |
|  | 81.3845 | 166 |

An alternative method of interaction minimization in multiple DLSO systems realized in embodiments of the present invention involves operating n DLSOs 10 in conjunction with n corresponding delay-line arrangements at differing frequencies $\omega_n$ and designing the control circuitry 30 such that for i=1 . . . n the $i^{th}$ DLSO 10 rejects all signals (electrical, electromagnetic or magnetic or a combination of these) apart from those corresponding to n=i. This may be achieved by incorporating a filter element (which may for example take the form of a bandpass or notch filter) in each DLSO 10 which filters the signal received from the delay-line arrangement prior to amplitude regulation and feedback. A phase compensating element may also be included to compensate for unwanted signal phase-shifts brought about by the presence of such a filtering element.

Design for Noise or Signal Resection

The principles detailed herein allow for the realization of DLSOs or systems of such oscillators substantially insensitive to a known electrical, electromagnetic or magnetic noise or signal source at a particular frequency. Insensitivity is achieved by arranging that the delay-line arrangement 20 particular to the DLSO or DLSOs presents a large effective impedance to an appropriately designed arrangement of control circuitry 30 if excited at the frequency or frequencies at which the noise or signal(s) occur whilst presenting a small effective impedance at the desired operating frequency. Alternatively such immunity may be achieved by a filtration technique e.g. the unwanted signal may be filtered out, or a signal at the desirable operating frequency preferentially amplified prior to the main amplification and amplitude regulation part of the DLSO control circuitry 30. In DLSOs where such a filtering element is present, a phase compensating element may be included to compensate for unwanted signal phase-shifts.

Design for Maximal Interaction in Multiple Oscillator Networks

In certain applications it may be desirable to realize a network or system of DLSOs which interact strongly with each other. For example, it may be required that one or more slave DLSOs operate in synchrony with a single master oscillator.

By realizing oscillators—oscillators 1 and 2—with independent delay-line arrangements 20: respectively delay-line arrangements 1 and 2, such that the operating frequency of oscillator 1, $\omega_1$ is co-incident with or proximal to a resonance frequency of delay-line arrangement 1 and co-incident with or proximal to a resonance frequency of delay-line arrangement 2 and vice-versa i.e. the operating frequency of oscillator 2, $\omega_2$ is co-incident with or proximal to a resonance frequency of delay-line arrangement 2 and co-incident with or proximal to an resonance frequency of delay-line arrangement 1, the two DLSOs may be made substantially dependent. Many possible methods of arranging this condition are possible and the technique may be extended to large networks of continuous or 'switched-mode' DLSOs. A trivial example of such an arrangement is a system or network of two or more identical DLSOs operating at the same frequency. More sophisticated systems operate non-identical DLSOs at differing, advantageous frequencies.

An alternative method of interaction maximization in multiple DLSO systems realized embodying the present invention involves operating n DLSOs in conjunction with n corresponding delay-line arrangements 20 at frequencies $\omega_n$ and designing the control electronics such that for i=1 ... n the $i^{th}$ DLSO is responsive to signals from all others, or from selected others. This may be achieved by incorporating a filter element (which may for example take the form of a bandpass or notch filter operating in the electrical, electromagnetic or magnetic domain) in each DLSO which filters the signal received from the delay-line arrangement prior to amplitude regulation and feedback. A phase compensating element (operating in the electrical, electromagnetic or magnetic domain) may also be included to compensate for unwanted signal phase-shifts brought about by the presence of such a filtering element.

Design for Noise or Signal Sensitivity

The principles set out herein allow for the realization of DLSOs or systems of such oscillators substantially sensitive to a known electrical, electromagnetic or magnetic noise or signal source at a particular frequency. Sensitivity is achieved by arranging that the delay-line arrangement particular to the DLSO or DLSOs presents a small effective impedance to the control circuitry 30 if excited at the frequency or frequencies at which the noise or unwanted signal occur. Alternatively such sensitivity may be achieved by incorporation of an additional, frequency dependent gain (in the electrical, electromagnetic or magnetic domain) into the DLSO control circuitry 30 prior to the main amplification and amplitude regulation part of the control circuitry 30. In DLSOs where such a frequency dependent gain is present, a phase compensating element (operating in the electrical, electromagnetic or magnetic domain) may be included to compensate for unwanted signal phase-shifts. Such systems may be useful in applications where there is a requirement for a sensitive, highly frequency selective detector.

Design for Maximal/Minimal Interaction in Oscillator Networks

A combination of the techniques above may be used to realize networks or arrays of DLSOs in which the interaction or lack of interaction between particular oscillators is determined by the design of the control circuitry 30, frequency selection impedance 220 and delay-line arrangement 20 of each DLSO.

Modes of Operation

DLSOs embodying the present invention may be operated continuously or in a pulsed or 'burst' mode—i.e. for short periods of time. Alternatively or additionally DLSOs may be realized in which a single set of circuitry representing the control circuitry 30 is used in conjunction with multiple electrical, electromagnetic or magnetic elements or delay-line arrangements 20. The DLSO may be such that a single element or delay-line arrangement 20 is operative at any one time—i.e. one of several delay-line arrangements or one of several electrical, electromagnetic or magnetic elements in conjunction with a given delay-line or arrangement of delay-lines are switched into operation electrically, magnetically, thermally, mechanically, optically or otherwise at any one time. Such switching may involve electrical or magnetic changes at the control circuitry 30 and/or the delay-line or delay-lines and/or the electrical, electromagnetic or magnetic element or elements and/or the delay-line arrangements 20. The operating frequencies particular to each delay-line arrangement 20 in such a DLSO may be the same or different.

In a further embodiment of the DLSO the frequency selection impedance or impedance stage (operating in the electrical, electromagnetic or magnetic domain) may be locally or remotely controlled. Such local or remote control may be electrical, magnetic, thermal, mechanical, optical, hydraulic etc. and may be such that the behaviour of the DLSO 10—for example the operating frequency—is dependent on this control.

In a further implementation of the DLSO, the operating mode may be controlled by an element or elements sensitive to some external stimulus such that the operating frequency of the DLSO is determined by this stimulus and in response to certain changes in this stimulus a step-wise change in the operating frequency of the DLSO is observed. The sensitive element or elements that determine the operating mode may be incorporated into the control circuitry 30 or may form part of the delay-line arrangement 20.

Delay-Lines Defined by Regions of Low Conductivity Media

Figure 28:
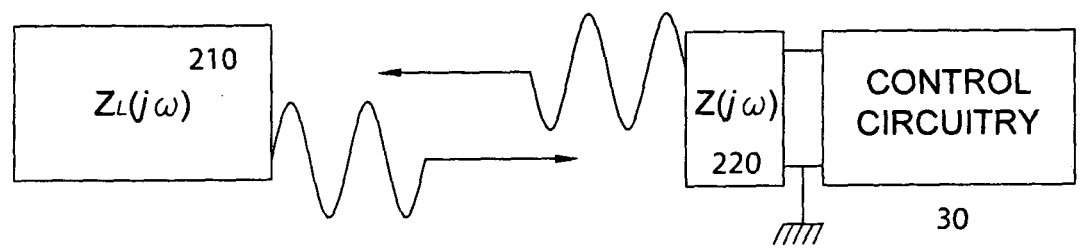
FIG. 28 shows a schematic arrangement of a DLSO in accordance with another embodiment of the present invention.

As established above, the DLSOs that embody the present invention may be realized in conjunction with delay-line arrangements 20 comprising or incorporating a delay-line or delay-lines defined by a region of free space or other low-conductivity transmission medium. This concept is illustrated schematically in the example system of FIG. 28. In such cases, transmitter and receiver elements (not shown) are provided to respectively supply and receive signal to and from the delay-line. The delay-line may be defined by a region of transmission medium or free space bounded by a certain boundary condition or boundary conditions, or as is the case in FIG. 28 the delay-line may be defined by the distance between the control circuitry 30 (and thus the transmit and receive system elements) and some other active or passive element $Z_L(j\omega)$ 210. Such systems may for example be used to realize sensitive distance measuring instruments (i.e. the distance between the control circuitry 30 and an active or passive element or elements may be determined from the characteristics of the resultant DLSO 10), or to excite certain electrical, electromagnetic or magnetic elements remotely and determine their characteristics (e.g. the element $Z_L(j\omega)$ 210 in FIG. 28 might represent a resonant electrical, electromagnetic or magnetic element it is desirable to interrogate), or to excite certain electrical, electromagnetic or magnetic elements remotely in order that they perform some electrical, electromagnetic or magnetic function. All possible implementations of the DLSO embodying the present invention may be realized in conjunction with such 'free space' or low conductivity delay-lines.

Although a specific embodiment of the present invention has been described, it is to be understood that various modifications and improvements could be contemplated by the skilled person.

The invention claimed is:

1. A delay-line self oscillator comprising:
an electrical, electromagnetic or magnetic delay-line arrangement;
an oscillator control circuitry; and
a frequency selection impedance having at least one of a frequency dependent magnitude or a frequency dependent phase shift, the frequency selection impedance connecting the delay-line arrangement and the oscillator control circuitry and presenting a frequency dependent impedance to the delay-line arrangement;
wherein the oscillator control circuitry includes an amplifier, a non-linear amplitude control element (N-LACE) and a driver,
wherein the non-linear amplitude control element (N-LACE) has an input and an output, and wherein the N-LACE is configured to:
provide a first dynamic gain, $g_{dSS}$, where an input signal received at the N-LACE input has a magnitude less than a threshold; and
provide a second dynamic gain, $g_{dLS}$, where the input signal has a magnitude greater than the threshold,
wherein the first dynamic gain, $g_{dSS}$ is greater than the second dynamic gain $g_{dLS}$,
wherein the delay-line self-oscillator is configured to initiate oscillations from noise within the system.

2. The delay-line self oscillator of claim 1, wherein the frequency selection impedance is configured to provide a frequency of oscillation of the delay-line self oscillator substantially at a characteristic antiresonance frequency of the combination of the delay-line arrangement and the frequency selection impedance.

3. The delay-line self oscillator of claim 1, wherein the N-LACE comprises an active device with a negative differential conductance for providing the first dynamic gain, $g_{dSS}$ and the second dynamic gain, $g_{dLS}$.

4. The delay-line self oscillator of claim 1, wherein the N-LACE comprises a differential amplifier arranged as a long tailed pair.

5. The delay-line self oscillator of claim 4, wherein the differential amplifier comprises first and second bipolar junction transistors, wherein each of the first and second bipolar transistors comprise an emitter connected in common to a first potential via a tail load, and wherein each of the first and second bipolar transistors comprise a collector connected to second and third potentials via first and second loads respectively, the control circuitry amplifier output being supplied as an input to the base of the second transistor when the base of the first transistor is held at a fixed potential.

6. The delay-line self oscillator of claim 1, wherein the oscillator control circuitry further includes a signal acquisition/conditioning means.

7. The delay-line self oscillator of claim 6, wherein the signal acquisition/conditioning means includes a frequency detector.

8. The delay-line self oscillator of claim 6, wherein the signal acquisition/conditioning means further includes a peak detector or demodulator.

9. The delay-line self oscillator of claim 1, wherein the delay-line arrangement includes one or more electromagnetic delay-lines.

10. The delay-line self oscillator of claim 1, wherein the delay-line arrangement includes one or more electrical delay-lines.

11. The delay-line self-oscillator of claim 1, wherein the delay-line arrangement includes one or more magnetic (spin-wave) delay-lines.

12. The delay-line self oscillator of claim 9, wherein the one or more delay-lines are formed from one or more of a length of coaxial transmission line, a waveguide, or a path in free space.

13. The delay-line self oscillator of claim 11 wherein the one or more delay-lines are formed from ferri- or ferro-magnetic waveguides composed of at least one of Yttrium Iron Garnet (YIG) or Permalloy.

14. The delay-line self oscillator of claim 9, wherein the delay-line arrangement further includes at least one of one or more lumped or one or more distributed-parameter electrical, electromagnetic or magnetic elements.

15. The delay-line self-oscillator of claim 1, wherein the frequency selection impedance includes a transformer.

16. The delay-line self-oscillator of claim 1, wherein the frequency selection impedance comprises first and second purely imaginary frequency dependent electrical, electromagnetic or magnetic impedances as an amplifier input stage with a frequency dependent transfer function, wherein the first and second impedances together present a particular impedance to the delay-line arrangement.

17. The delay-line self-oscillator of claim 16, further comprising a third purely imaginary frequency dependent electrical, electromagnetic or magnetic impedance in parallel with the first and second purely imaginary frequency dependent impedances.

18. The delay-line self-oscillator of claim 14, wherein the at least one of the one or more lumped or one or more distributed-parameter electrical, electromagnetic or magnetic elements form a resonant system having a first quality factor Q1 and providing a frequency dependent gain, wherein the remaining components of the delay-line arrangement have a quality factor Q2 that is higher than the quality factor Q1 of the one or more electrical, electromagnetic or magnetic elements, and wherein the delay-line arrangement further includes a variable capacitor diode for adjusting the location of the resonant or anti-resonant peak of the at least one of the one or more lumped or one or more distributed-parameter electrical, electromagnetic or magnetic elements.

19. The delay-line self-oscillator of claim 1, wherein the delay-line arrangement is terminated by an electrical, electromagnetic or magnetic impedance.

20. The delay-line self oscillator of claim 1, further comprising one or more signal processing elements configured to stabilize the delay-line self oscillator in a single operating mode.

21. The delay-line self-oscillator of claim 20, wherein the one or more signal processing elements includes a means for varying an electrical, electromagnetic or magnetic frequency dependent transfer function.

22. The delay-line self oscillator of claim 1, wherein the frequency selection impedance is configured to provide a frequency of oscillation of the delay-line self oscillator substantially at a characteristic resonance frequency of the delay-line arrangement.

23. The delay-line self oscillator of claim 1, wherein the frequency selection impedance is configured to provide a frequency of oscillation of the delay-line self oscillator substantially at a characteristic antiresonance frequency of the delay-line arrangement.

24. The delay-line self oscillator of claim 1, wherein the frequency selection impedance is configured to provide a frequency of oscillation of the delay-line self oscillator substantially at a characteristic resonance frequency of the combination of the delay-line arrangement and the frequency selection impedance.

\* \* \* \* \*

UNITED STATES PATENT AND TRADEMARK OFFICE
CERTIFICATE OF CORRECTION

PATENT NO. : 8,614,606 B2  Page 1 of 1
APPLICATION NO. : 13/144878
DATED : December 24, 2013
INVENTOR(S) : Gregg et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 100 days.

Signed and Sealed this
Twenty-second Day of September, 2015

Michelle K. Lee
*Director of the United States Patent and Trademark Office*